United States Patent
Sato

(10) Patent No.: US 9,293,498 B2
(45) Date of Patent: Mar. 22, 2016

(54) SOLID-STATE IMAGING ELEMENT AND ELECTRONIC DEVICE

(71) Applicant: Sony Corporation, Tokyo (JP)

(72) Inventor: Naoyuki Sato, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/361,720

(22) PCT Filed: Dec. 4, 2012

(86) PCT No.: PCT/JP2012/081306
§ 371 (c)(1),
(2) Date: May 30, 2014

(87) PCT Pub. No.: WO2013/088984
PCT Pub. Date: Jun. 20, 2013

(65) Prior Publication Data
US 2015/0279892 A1 Oct. 1, 2015

(30) Foreign Application Priority Data

Dec. 14, 2011 (JP) ................................ 2011-273819
Jun. 1, 2012 (JP) ................................ 2012-125657

(51) Int. Cl.
*H01L 31/102* (2006.01)
*H01L 27/146* (2006.01)

(52) U.S. Cl.
CPC ...... *H01L 27/14636* (2013.01); *H01L 27/1461* (2013.01); *H01L 27/1462* (2013.01); *H01L 27/14609* (2013.01); *H01L 27/14638* (2013.01)

(58) Field of Classification Search
USPC ............. 257/81, 82, 116, 117, 432–437, 457, 257/459, 749, E51.018–E51.022, 292, 184; 438/22–47, 69, 493, 503, 507, 956, 72
See application file for complete search history.

(56) References Cited

U.S. PATENT DOCUMENTS

| | | | | |
|---|---|---|---|---|
| 7,880,255 B2 * | 2/2011 | Baggenstoss | ..... | H01L 27/14601 257/436 |
| 8,716,719 B2 * | 5/2014 | Matsumura | ....... | H01L 27/14612 257/293 |
| 2006/0102938 A1 * | 5/2006 | Park | ................ | H01L 27/14609 257/292 |
| 2006/0157761 A1 * | 7/2006 | Park | ................ | H01L 27/14609 257/293 |
| 2007/0045685 A1 * | 3/2007 | Yang | ................ | H01L 27/14621 257/294 |
| 2011/0025892 A1 * | 2/2011 | Hibbeler | ........... | H01L 27/14609 348/294 |
| 2011/0159632 A1 * | 6/2011 | Sueyoshi | .............. | C23C 16/345 438/72 |
| 2011/0242386 A1 * | 10/2011 | Machida | ........... | H01L 27/14603 348/308 |
| 2011/0242390 A1 * | 10/2011 | Sogoh | ............... | H01L 27/14609 348/311 |

FOREIGN PATENT DOCUMENTS

| | | |
|---|---|---|
| JP | 2010-182887 | 8/2010 |
| JP | 2011-199816 | 10/2011 |
| JP | 2011-216639 | 10/2011 |

OTHER PUBLICATIONS

International Search Report; International Application No. PCT/JP2012/081306; Date: Dec. 4, 2012; Date of completion of the International Search: Feb. 25, 2013. (Form PCT/ISA/210).

Written Opinion of the International Searching Authority; International Application No. PCT/JP2012/081306; Date of Written Opinion: Mar. 5, 2013. (Form PCT/ISA/220 and PCT/ISA/237).

* cited by examiner

*Primary Examiner* — Dao H Nguyen
*Assistant Examiner* — Tram H Nguyen
(74) *Attorney, Agent, or Firm* — Hazuki International, LLC

(57) ABSTRACT

The present disclosure relates to a solid-state imaging element and an electronic device capable of suppressing occurrence of a dark current and acquiring higher image quality. The solid-state imaging element includes a high-concentration diffusion layer configured to serve as a connection portion by which a wiring is connected to a semiconductor substrate, and a junction leak control film formed to cover a surface of the diffusion layer. Also, to connect the wiring to the diffusion layer, a width of an opening formed in an insulation film stacked on the semiconductor substrate is greater than a width of the diffusion layer. Further, in a charge accumulation portion configured to accumulate a charge generated by a photoelectric conversion portion generating the charge according to an amount of received light, the junction leak control film is also used as a capacitor film of the charge accumulation portion. Furthermore, a stack structure in which a silicon oxide or low interface state oxide film is formed is included between the diffusion layer and the junction leak control film. The present technology can be applied to, for example, a CMOS image sensor.

16 Claims, 18 Drawing Sheets

FIG. 11
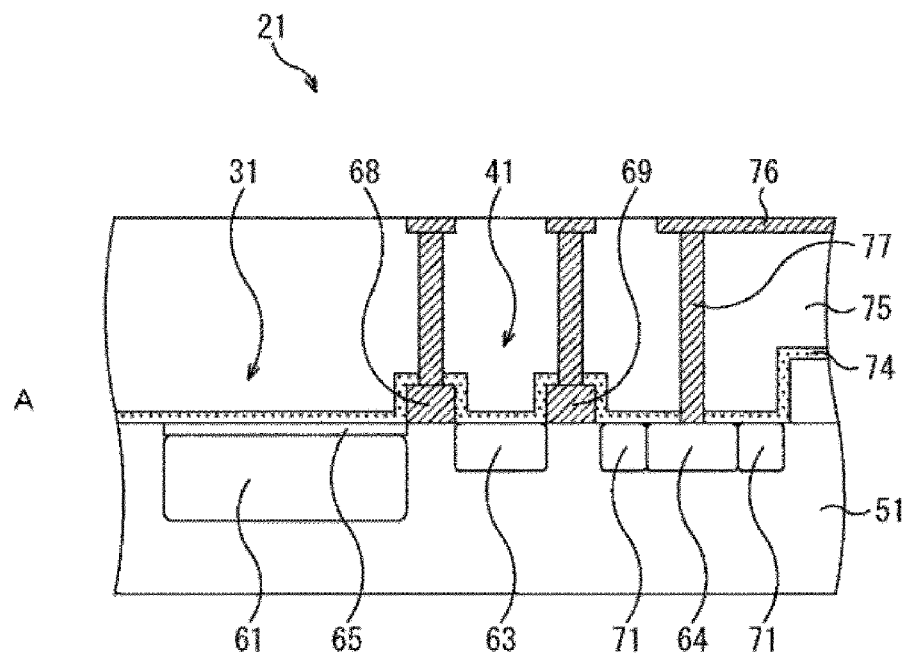
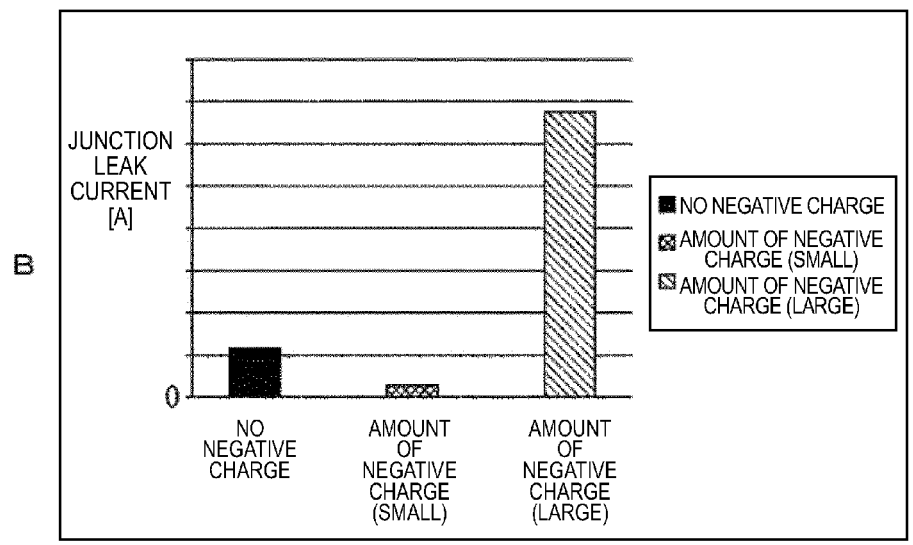

# SOLID-STATE IMAGING ELEMENT AND ELECTRONIC DEVICE

TECHNICAL FIELD

The present disclosure relates to a solid-state imaging element and an electronic device, and more particularly, to a solid-state imaging element and an electronic device capable of suppressing occurrence of a dark current and acquiring higher image quality.

BACKGROUND ART

In recent years, miniaturization for reduction in cost, increases in numbers of pixels, and high functionality have progressed for CMOS (Complementary Metal Oxide Semiconductor) image sensors mounted on electronic devices such as mobile phone devices, digital still cameras, and digital video cameras.

In general, incident light incident on a CMOS image sensor is subjected to photoelectric conversion by, for example, a PD (photodiode) which is a photoelectric conversion portion included in a pixel. Then, a charge generated by the PD is transmitted to an FD (Floating Diffusion) which is a floating diffusion region via a transfer transistor, and an amplification transistor outputs a pixel signal with a level according to the charge accumulated in the FD.

In the related art, in a CMOS image sensor, a rolling shutter scheme of sequentially transmitting a charge from a PD to an FD for each row of pixels and reading the charge of the FD has been adopted. In the rolling shutter scheme, distortion has occurred in an image in some cases since exposure timings of the pixels are different between an upper-side row and a lower-side row of a CMOS image sensor.

On the other hand, in a CMOS image sensor including a charge accumulation portion for each pixel, a global shutter scheme of sequentially transmitting and reading charges from the accumulation portions to FDs after simultaneously transmitting the charges from PDs to the charge accumulation portions for all of the pixels has been developed. In the global shutter scheme, distortion can be prevented from occurring in an image since exposure timings of all of the pixels are identical.

In a CMOS image sensor in which the global shutter scheme is adopted, an accumulation time of a charge in a charge accumulation portion or a diffusion layer formed in a pixel is longer than in the rolling shutter scheme. For this reason, spouting of electrons on the surface of a semiconductor substrate may increase in a diffusion layer (high-concentration N-type region) of the charge accumulation portion, and thus a dark current may increase.

Accordingly, the applicants of the present application have been developing a solid-state imaging element capable of suppressing occurrence of a dark current, for example, by applying a negative charge to an upper light-shielding film of a PD so that a hole is filled and by absorbing a dark current occurring in an interface in the hole.

Also, in a CMOS image sensor disclosed in Patent Literature 2, a diffusion layer portion (high-concentration N layer) is formed by a process of forming a capacitor film inside a pixel or a passage through which a charge accumulated in a capacitor inside the pixel is transmitted.

CITATION LIST

Patent Literature

Patent Literature 1: JP 2010-182887A
Patent Literature 2: JP 2011-199816A

SUMMARY OF INVENTION

Technical Problem

However, as disclosed in Patent Literature 1, not only is occurrence of a dark current in a PD suppressed, but a dark current also occurs in a portion other than the PD, thereby having an adverse influence on image quality in some cases.

The present disclosure has been devised in view of such circumstances and an object of the present disclosure is to suppress occurrence of a dark current and acquire higher image quality.

Solution to Problem

According to an aspect of the present disclosure, there is provided a solid-state imaging element including: a high-concentration diffusion layer configured to serve as a connection portion by which a wiring is connected to a semiconductor substrate; and a junction leak control film formed to cover a surface of the diffusion layer.

According to another aspect of the present disclosure, there is provided an electronic device including a solid-state imaging element configured to include a high-concentration diffusion layer serving as a connection portion by which a wiring is connected to a semiconductor substrate, and a junction leak control film formed to cover a surface of the diffusion layer.

According to a still another aspect of the present disclosure, a junction leak control film is formed to cover a surface of a high-concentration diffusion layer serving as a connection portion by which a wiring is connected to a semiconductor substrate.

Advantageous Effects of Invention

According to an aspect of the present disclosure, it is possible to suppress occurrence of a dark current and acquire higher image quality.

BRIEF DESCRIPTION OF DRAWINGS

FIGS. 11A-B are diagrams illustrating a relation between the magnitude of a negative fixed charge and a junction leak current.

DESCRIPTION OF EMBODIMENTS

Hereinafter, concrete embodiments to which the present technology is applied will be described in detail with reference to the drawings.

Figure 1:
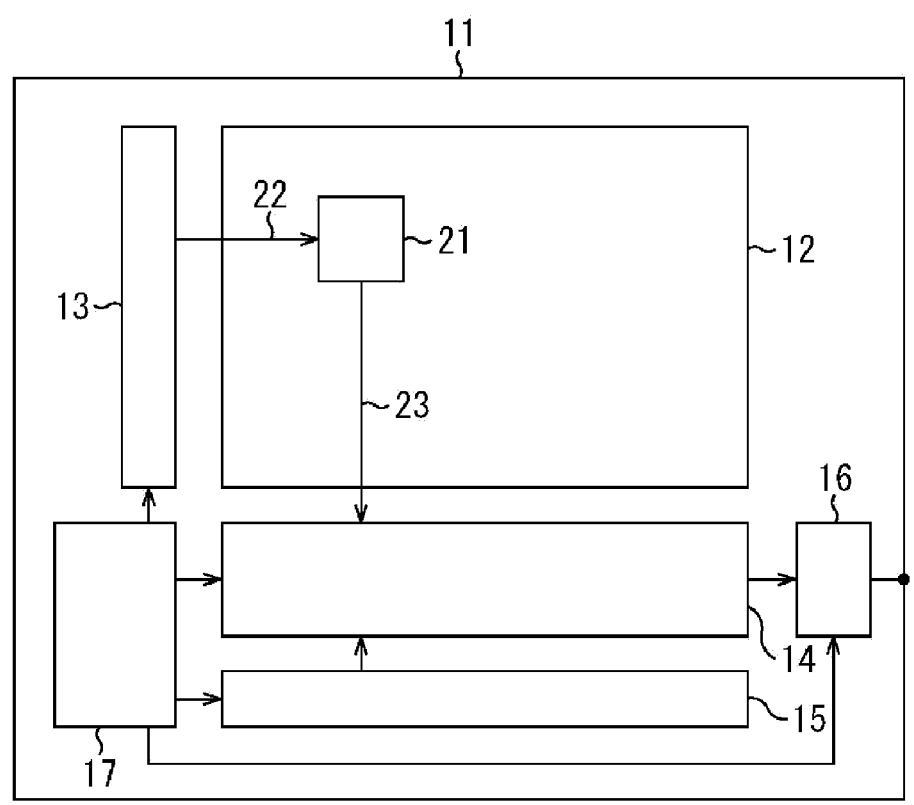
FIG. 1 is a block diagram illustrating a configuration example of an embodiment of an imaging element to which the present invention is applied.

FIG. 1 is a block diagram illustrating a configuration example of an embodiment of an imaging element to which the present invention is applied.

The solid-state imaging element 11 is configured to include a pixel array unit 12, a vertical driving unit 13, a column processing unit 14, a horizontal driving unit 15, an output unit 16, and a driving control unit 17, as illustrated in FIG. 1.

The pixel array unit 12 includes a plurality of pixels 21 arranged in an array form and is connected to the vertical driving unit 13 through a plurality of horizontal signal lines 22 corresponding to the number of rows of the pixels 21 and to the column processing unit 14 through a plurality of vertical signal lines 23 corresponding to the number of columns of the pixels 21. In other words, each of the plurality of pixels 21 included in the pixel array unit 12 is arranged at a point at which the horizontal signal lines 22 and the vertical signal lines 23 intersect.

The vertical driving unit 13 sequentially supplies a driving signal (a transfer signal, a selection signal, a reset signal or the like) for driving each pixel 21 to each of the rows of the plurality of pixels 21 included in the pixel array unit 12 through the horizontal signal lines 22.

The column processing unit 14 performs a CDS (Correlated Double Sampling) process on a pixel signal output through the vertical signal line 23 from each pixel 21 to extract a signal level of the pixel signal and acquire pixel data corresponding to a light reception amount of the pixel 21.

The horizontal driving unit 15 sequentially supplies a driving signal for causing the pixel data acquired from each pixel 21 to be sequentially output from the column processing unit 14, to the column processing unit 14 for each of the columns of the plurality of pixels 21 included in the pixel array unit 12.

The pixel data is supplied from the column processing unit 14 to the output unit 16 at a timing according to the driving signal of the horizontal driving unit 15, and the output unit 16 amplifies, for example, the pixel data and outputs the resultant pixel data to an image processing circuit of a subsequent stage.

The driving control unit 17 controls driving of each block in the solid-state imaging element 11. For example, the driving control unit 17 generates a clock signal according to a driving period of each block and supplies the clock signal to each block.

Next, a configuration example of the pixel 21 will be described with reference to FIG. 2.

Figure 2:
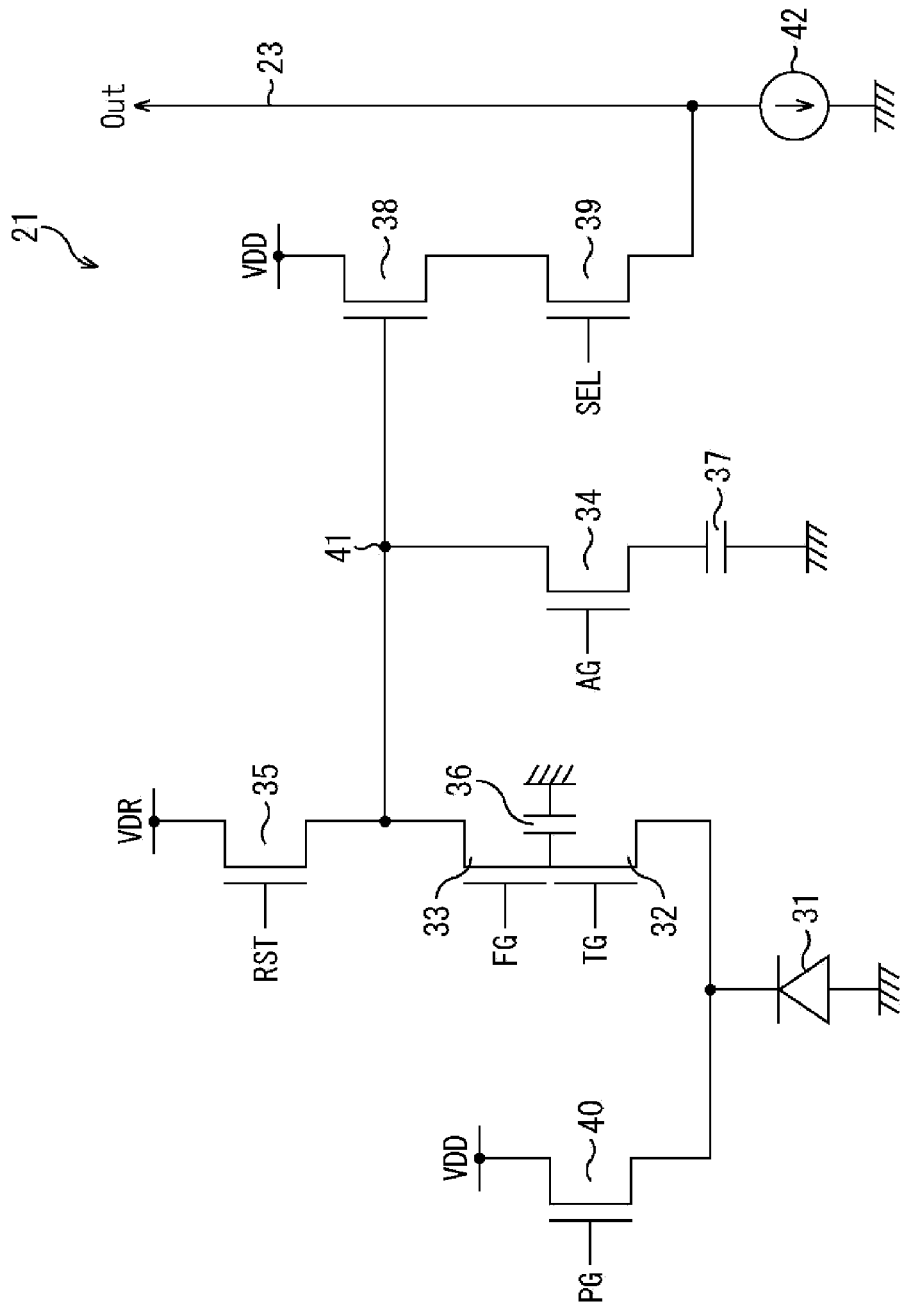
FIG. 2 is a diagram illustrating a configuration example of a pixel.

As illustrated in FIG. 2, the pixel 21 is configured to include a PD 31, a first transfer gate 32, a second transfer gate 33, a third transfer gate 34, a reset transistor 35, a first charge accumulation portion 36, a second charge accumulation portion 37, an amplification transistor 38, a selection transistor 39, a charge discharge gate 40, and an FD 41. Also, a constant current source 42 for outputting a pixel signal from the pixel 21 is connected through the vertical signal line 23 to the pixel 21.

The PD 31 is a photoelectric conversion portion which receives light radiated to the pixel 21, and generates and accumulates a charge according to an intensity of the light.

The first transfer gate 32 is driven according to a transfer signal TG supplied from the vertical driving unit 13. When the first transfer gate 32 is turned on, the charge accumulated in the PD 31 is transferred to the first charge accumulation portion 36. Here, in the solid-state imaging element 11, the transfer of the charge from the PD 31 to the first charge accumulation portion 36 is performed simultaneously (at the same timing) in all of the PDs 31.

The second transfer gate 33 is driven according to a transfer signal FG supplied from the vertical driving unit 13. When the second transfer gate 33 is turned on, the charge accumulated in the first charge accumulation portion 36 is transferred to the FD 41.

The third transfer gate 34 is driven according to a transfer signal AG supplied from the vertical driving unit 13. When the third transfer gate 34 is turned on, the FD 41 and the second charge accumulation portion 37 enter a connection state.

The reset transistor 35 is driven according to a reset signal RST supplied from the vertical driving unit 13. When the reset transistor 35 is turned on, the charge accumulated in the FD 41 is discharged to a power supply potential VDR and the FD 41 is thus reset.

The first charge accumulation portion 36 is configured such that one terminal thereof is connected between the first transfer gate 32 and the second transfer gate 33 and the other terminal thereof is grounded (GND), and accumulates the charge transferred from the PD 31 through the first transfer gate 32.

The second charge accumulation portion 37 is configured such that one terminal thereof is connected to the FD 41 through the third transfer gate 34 and the other terminal thereof is grounded (GND), and accumulates the charge along with the FD 41 according to the driving of the third transfer gate 34.

The amplification transistor 38 outputs a pixel signal with a level according to the charge generated by the PD 31, transferred through the first transfer gate 32 and the second transfer gate 33, and accumulated in the FD 41, to the vertical signal line 23 through the selection transistor 39.

The selection transistor 39 is driven according to a selection signal SEL supplied from the vertical driving unit 13 and enters a state in which the pixel signal from the amplification transistor 38 can be output to the vertical signal line 23 when the selection transistor 39 is turned on.

The charge discharge gate 40 is driven according to a discharge signal PG supplied from the vertical driving unit 13. When the charge discharge gate 40 is turned on, the charge generated by the PD 31 and accumulated is discharged to a power supply potential VDD and the PD 31 is thus reset.

The FD 41 is a floating diffusion region including a predetermined accumulation capacitor connected to a gate electrode of the amplification transistor 38 and accumulates the charge generated by the PD 31. Also, the charge generated by the PD 31 is accumulated only in the FD 41 when the third transfer gate 34 is turned off, and is accumulated in the FD 41 and the second charge accumulation portion 37 when the third transfer gate 34 is turned on.

Here, in the pixel 21, an embedded MOS capacitor is used in the first charge accumulation portion 36, and a capacitor having a larger capacity value per unit area than the first charge accumulation portion 36 is used in the second charge accumulation portion 37. Thus, a larger amount of saturated charge can be ensured. Also, a charge generated by the PD 31 at the time of low illuminance is accumulated by the first charge accumulation portion 36 with good dark-time characteristics. On the other hand, the pixel 21 is driven such that a charge generated by the PD 31 at the time of high illuminance is accumulated in the first charge accumulation portion 36 and the second charge accumulation portion 37 with the larger capacity. Thus, it is possible to acquire an image in which noise is small even at low luminance and a corresponding dynamic range is wide even at high luminance.

Next, a cross-sectional configuration example of a semiconductor substrate forming the pixel 21 will be described with reference to FIG. 3.

Figure 3:
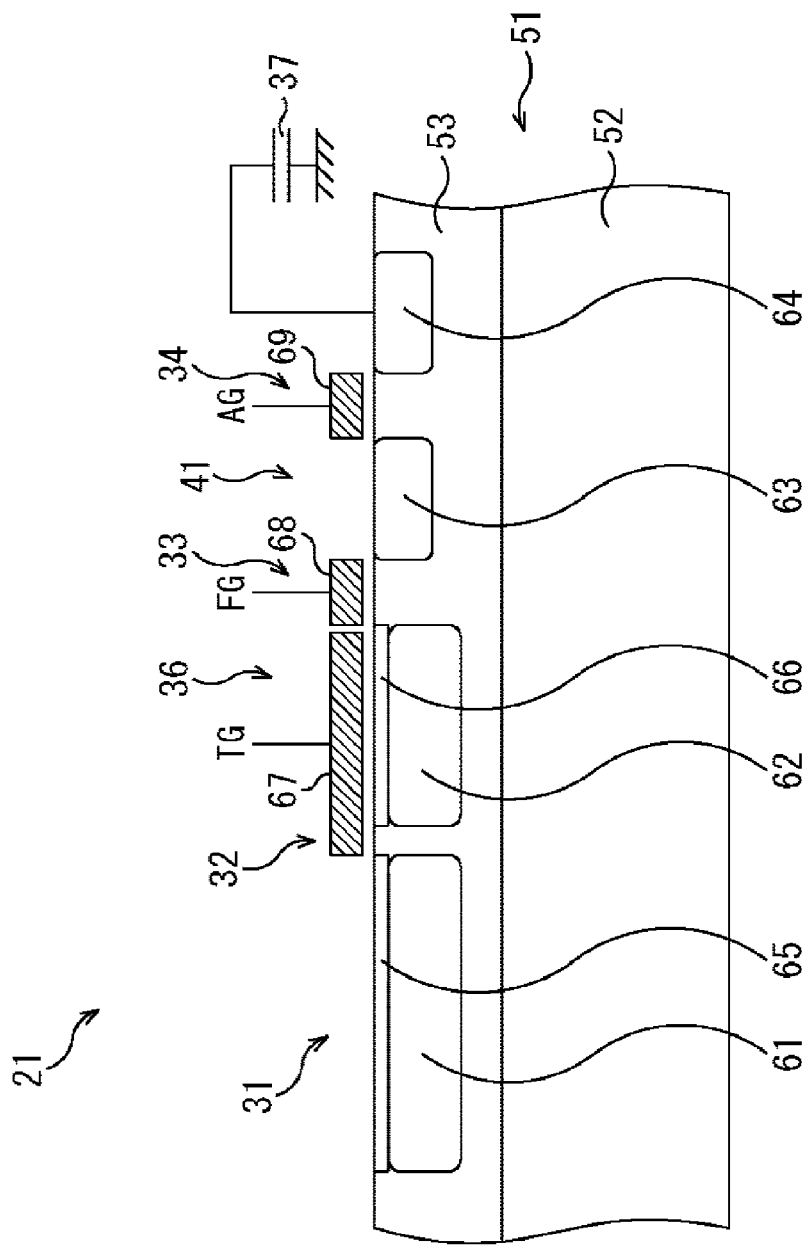
FIG. 3 is a diagram illustrating a cross-sectional configuration example of a semiconductor substrate forming the pixel.

As illustrated in FIG. 3, the pixel 21 is formed in a semiconductor substrate 51, and the semiconductor substrate 51 is configured such that a P-type well 53 is formed on, for example, a surface side of an N-type semiconductor substrate (N-sub) 52. Also, N-type semiconductor regions 61 to 64 and P-type semiconductor regions 65 and 66 are formed in the P-type well 53, and gate electrodes 67 to 69 are formed on the surface of the P-type well 53 with insulation films (not illustrated) interposed therebetween.

The N-type semiconductor region 61 and the P-type semiconductor region 65 are included in the PD 31, the N-type semiconductor region 62 and the P-type semiconductor region 66 are included in the first charge accumulation portion 36, and the N-type semiconductor region 63 is included in the FD 41.

The N-type semiconductor region 64 is a diffusion layer which serves as a contact connecting a wiring for electric connection with the second charge accumulation portion 37 to the semiconductor substrate 51 and is a layer (N+) formed of a high-concentration N-type.

The gate electrode 67 is formed to cover the first charge accumulation portion 36 and a region between the PD 31 and the first charge accumulation portion 36, and is included in the first transfer gate 32. The gate electrode 68 is formed in a region between the first charge accumulation portion 36 and the FD 41 and is included in the second transfer gate 33. The gate electrode 69 is formed in a region between the FD 41 and the N-type semiconductor region 64 and is included in the third transfer gate 34.

In the pixel 21 configured in this way, the charge generated at the time of reception of light in the PD 31 is transferred from the PD 31 to the first charge accumulation portion 36 when the first transfer gate 32 is turned on according to the transfer signal TG supplied to the gate electrode 67. Then, when the second transfer gate 33 is turned on according to the transfer signal FG supplied to the gate electrode 68, the charge accumulated in the first charge accumulation portion 36 is transferred to the FD 41. At this time, when the third transfer gate 34 is turned on according to the transfer signal AG supplied to the gate electrode 69, the charge transferred to the FD 41 is also accumulated in the second charge accumulation portion 37.

Figure 4:
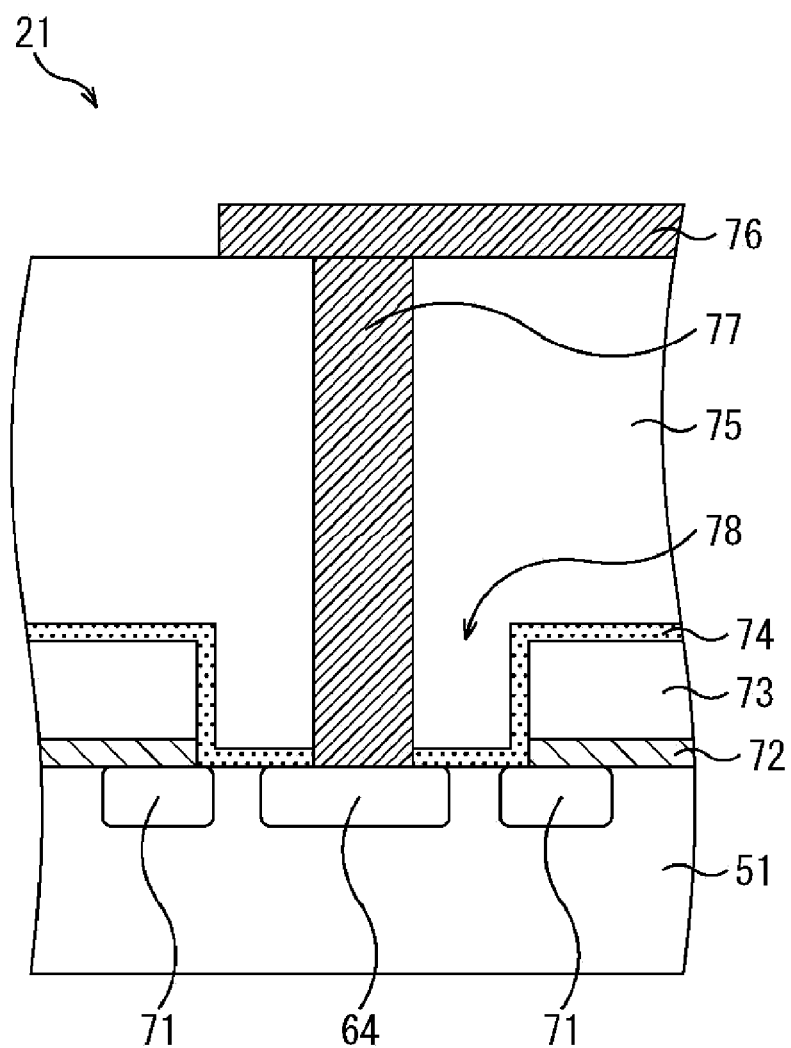
FIG. 4 is a diagram illustrating a cross-sectional configuration of the vicinity of an N-type semiconductor region of the pixel of a first configuration example.

Next, a first configuration example of the pixel 21 will be described with reference to FIG. 4. FIG. 4 illustrates a cross-sectional configuration of the vicinity of the N-type semiconductor region in the pixel 21 of a first configuration example.

As illustrated in FIG. 4, in the semiconductor substrate 51, P-type semiconductor regions 71 are formed at a predetermined interval from the N-type semiconductor region 64. Also, an insulation film 72, an anti-reflection film 73, a junction leak control film 74, an inter-layer film 75, and a wiring 76 are stacked in order from the surface side of the semiconductor substrate 51. Then, a through electrode 77 is formed to connect the N-type semiconductor region 64 to the wiring 76.

P-type semiconductor regions 71 are formed at the predetermined interval from the N-type semiconductor region 64, for example, to surround the periphery of the N-type semiconductor region 64.

The insulation film 72 is a silicide prevention film (for example, SiO/Sin). The solid-state imaging element 11 includes peripheral circuits (for example, the vertical driving unit 13, the column processing unit 14, the horizontal driving unit 15, the output unit 16, and the driving control unit 17 in FIG. 1) in addition to the pixel 21. Thus, in general, the silicide prevention film is also formed in the pixel 21 since a silicide is formed.

The anti-reflection film 73 is an insulation film (for example, HS—SiN) that has a function of preventing light incident on the PD 31 from being reflected in a surface-type CMOS image sensor. Also, the anti-reflection film 73 functions as a stopper layer when contact processing is performed.

Also, in the insulation film 72 and the anti-reflection film 73, an opening 78 is formed to correspond to the position at which the N-type semiconductor region 64 is formed. The opening 78 is formed such that the entire surface of the N-type semiconductor region 64 is reliably opened and a range larger than the N-type semiconductor region 64, e.g., a range also including a region between the N-type semiconductor region 64 and the P-type semiconductor region 71, is opened.

The junction leak control film 74 is formed to cover the surface of the N-type semiconductor region 64 and is a fixed charge film (for example, $HfO_2$ or $Al_2O_3$) having a negative fixed charge (for example, an amount of charge: $-3E11$ cm$^{-2}$ in the case of $HfO_2$) with respect to the N-type semiconductor region 64. The junction leak control film 74 is formed to have a film thickness of, for example, about 1 nm to about 15 nm.

The inter-layer film 75 is formed between wirings (the wiring 76 or other wirings (not illustrated)) formed in a plurality of layers in a wiring layer stacked in the semiconductor substrate included in the solid-state imaging element 11 to insulate the wirings from each other.

The wiring 76 is formed to be stacked on the inter-layer film 75 and is connected to a through electrode (for example, a through electrode 83 of FIG. 6 to be described below) connected to the second charge accumulation portion 37.

The through electrode 77 is formed in a contact hole formed to penetrate through the junction leak control film 74 and the inter-layer film 75 and connects the N-type semiconductor region 64 to the wiring 76.

Figure 5:
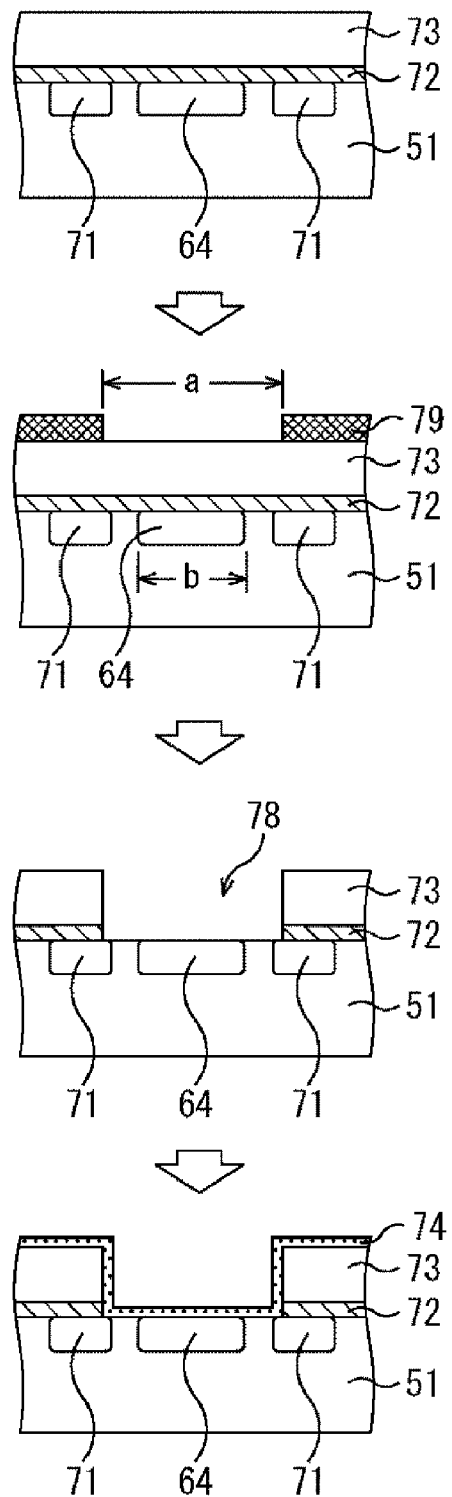
FIG. 5 is a diagram illustrating a process of manufacturing the vicinity of the N-type semiconductor region in the pixel of the first configuration example.

Next, a process of manufacturing the vicinity of the N-type semiconductor region 64 in the pixel 21 will be described with reference to FIG. 5.

First, in a first process, after the N-type semiconductor region 64 and the P-type semiconductor regions 71 are formed by performing ion implantation on the semiconductor substrate 51, the insulation film 72 and the anti-reflection film 73 are formed on the surface of the semiconductor substrate 51. Here, the P-type semiconductor regions 71 are formed at the predetermined interval from the N-type semiconductor region 64.

Next, in a second process, a photoresist film 79 is formed on the surface of the anti-reflection film 73. The photoresist film 79 is patterned to be opened so as to correspond to the opening 78 formed in the insulation film 72 and the anti-reflection film 73. Here, as illustrated in FIG. 5, an opening width a of the patterned photoresist film 79 is greater than a width b of the N-type semiconductor region 64.

Also, in a third process, the opening 78 is formed in the insulation film 72 and the anti-reflection film 73, and thus the photoresist film 79 is removed. At this time, to avoid physical scraping of the N-type semiconductor region 64, the anti-reflection film 73 is first processed by dry etching so that the process is stopped by the insulation film 72. Thereafter, the insulation film 72 is processed by wet etching using, for example, dilute hydrofluoric acid (DHF) so that the opening 78 is formed.

Then, in a fourth process, the junction leak control film 74 is formed on the entire surface. Also, the junction leak control film 74 is patterned for a desired layout and is processed by dry etching.

Thereafter, as illustrated in FIG. 4, the inter-layer film 75 is stacked on the junction leak control film 74, the contact hole is formed, the through electrode 77 is formed, and the wiring 76 is subsequently formed.

In the pixel 21, as described above, the opening 78 is formed before the inter-layer film 75 is stacked, and then the junction leak control film 74 with a negative fixed charge is formed on the N-type semiconductor region 64 so as to cover the N-type semiconductor region 64. Thus, since a source (depletion layer area) in which electrons spout on the outermost surface of the N-type semiconductor region 64 can be reduced, it is possible to reduce a junction leak current flowing from the N-type semiconductor region 64 to the semiconductor substrate 51.

That is, when the global shutter scheme is adopted in the solid-state imaging element 11, a time taken to accumulate the charge transferred from the PD 31 in the N-type semiconductor region 64 is lengthened. For this reason, when the junction leak control film 74 is not formed, there is a concern that spouting of electrons from the surface of the N-type semiconductor region 64 may increase and dark current characteristics of the pixel 21 may deteriorate. However, by forming the junction leak control film 74 in the pixel 21, it is possible to prevent the dark current characteristics of the pixel 21 from deteriorating.

In particular, since the opening 78 is formed with respect to the N-type semiconductor region 64 of the pixel 21 to have a larger width than the N-type semiconductor region 64, the junction leak control film 74 can be formed so that the surface of the N-type semiconductor region 64 can be reliably covered. Thus, by covering the entire surface of the N-type semiconductor region 64 with the junction leak control film 74, it is possible to prevent a junction leak current from occurring to the utmost extent.

Also, since a dark current inside the pixel 21 can be suppressed by reducing the junction leak current, occurrence of noise by the dark current can be suppressed in an image captured in the solid-state imaging element 11, thereby improving image quality.

Also, the junction leak control film 74 can also be used as, for example, a capacitor film in the second charge accumulation portion 37.

Figure 6:
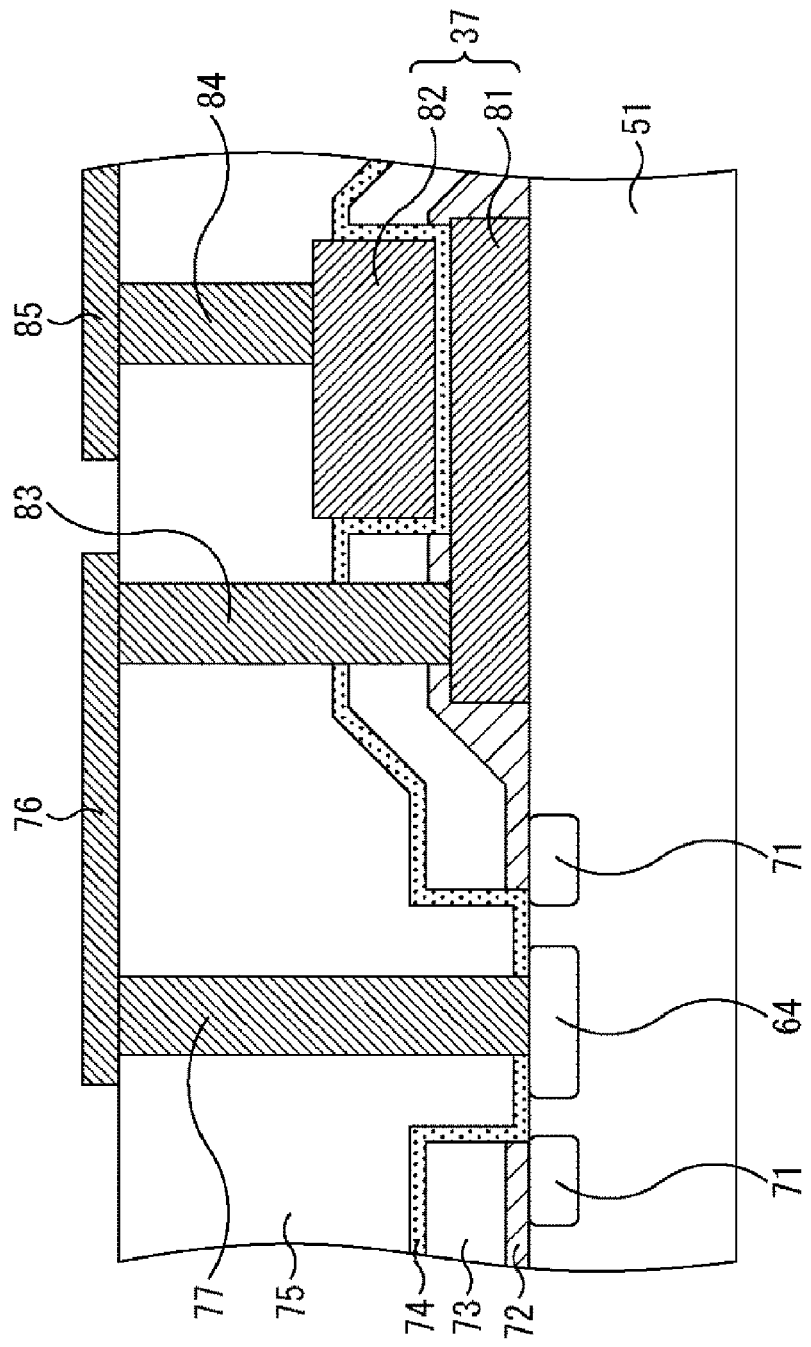
FIG. 6 is a diagram illustrating a cross-sectional configuration of the vicinity of the N-type semiconductor region and the second charge accumulation portion in the pixel of the first configuration example.

FIG. 6 illustrates a cross-sectional configuration of the vicinity of the N-type semiconductor region 64 and the second charge accumulation portion 37 in the pixel 21. Also, in FIG. 6, since the configuration of the vicinity of the N-type semiconductor region 64 is common to the configuration in FIG. 4, the detailed configuration will be omitted.

As illustrated in FIG. 6, the second charge accumulation portion 37 includes a lower electrode 81 stacked on the semiconductor substrate 51 and an upper electrode 82 stacked on the lower electrode 81 with the junction leak control film 74 interposed therebetween.

The lower electrode 81 is, for example, a polysilicon electrode and is connected to the wiring 76 through the through electrode 83. That is, the lower electrode 81 is connected to the N-type semiconductor region 64 through the through electrode 83, the wiring 76, and the through electrode 77. On the other hand, the upper electrode 82 is grounded through a through electrode 84 and a wiring 85.

Thus, the junction leak control film 74 is formed to be sandwiched between the lower electrode 81 and the upper electrode 82 included in the second charge accumulation portion 37, and thus can serve as the capacitor film of the second charge accumulation portion 37.

That is, when the pixel 21 is manufactured, the junction leak control film 74 can be formed on the N-type semiconductor region 64 and the capacitor film of the second charge accumulation portion 37 can be formed. Thus, it is possible to shorten the process of manufacturing the pixel 21.

Next, a pixel 21A of a second configuration example will be described with reference to FIG. 7. The pixel 21A has the same configuration as the pixel 21 described with reference to FIGS. 2 and 3, and a connection configuration with a second charge accumulation portion 37 in an N-type semiconductor region 64 is different from the connection configuration described with reference to FIG. 4.

Figure 7:
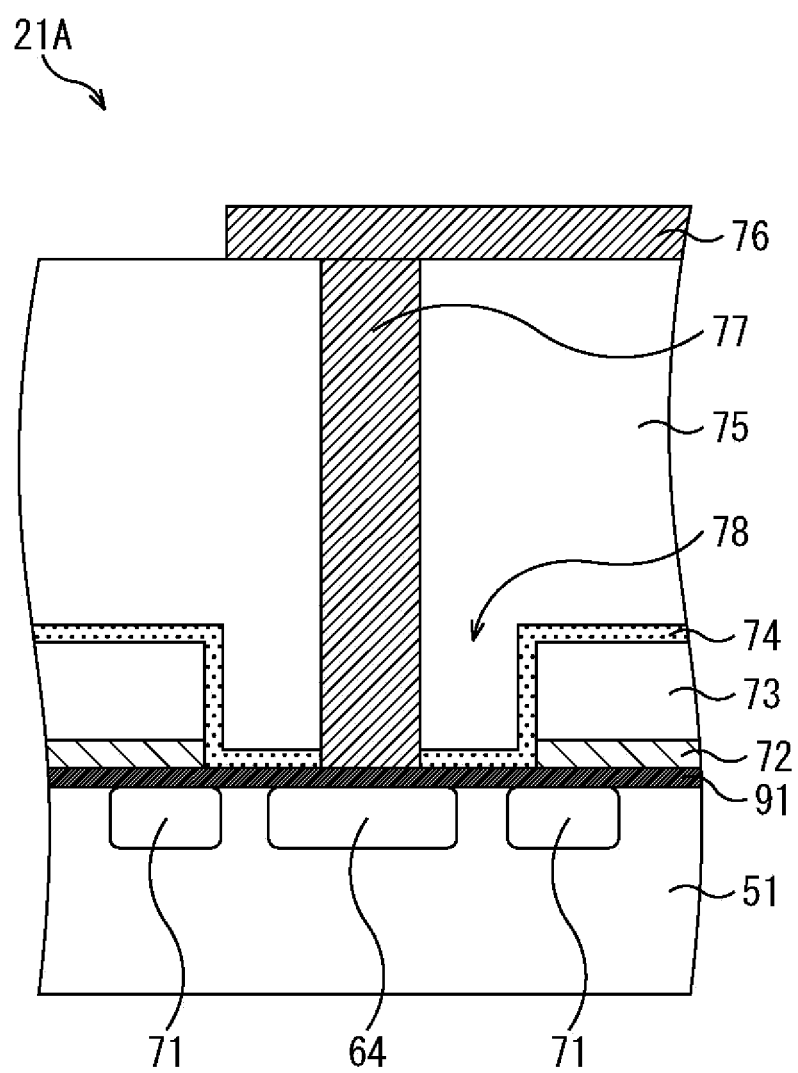
FIG. 7 is a diagram illustrating a cross-sectional configuration of the vicinity of an N-type semiconductor region in a pixel of a second configuration example.

FIG. 7 illustrates a cross-sectional configuration of the vicinity of the N-type semiconductor region 64 in the pixel 21A.

As illustrated in FIG. 7, the pixel 21A has a different configuration from the pixel 21 in FIG. 4 in that a silicon oxide or low interface state oxide film 91 is formed on the semiconductor substrate 51 in which the N-type semiconductor region 64 is formed. In addition, whereas the through electrode 77 is configured to come into direct contact with the N-type semiconductor region 64 in the pixel 21 in FIG. 4, the silicon oxide or low interface state oxide film 91 is configured to be interposed between the through electrode 77 and the N-type semiconductor region 64 in the pixel 21A.

That is, in the pixel 21A, the silicon oxide or low interface state oxide film 91, the insulation film 72, the anti-reflection film 73, the junction leak control film 74, the inter-layer film 75, and the wiring 76 are stacked in order from the surface side of the semiconductor substrate 51. In addition, after the opening 78 is formed in the insulation film 72 and the anti-reflection film 73, the junction leak control film 74 is formed to cover the surface of the N-type semiconductor region 64 via the silicon oxide or low interface state oxide film 91. Thus, a configuration having a stack structure in which the silicon oxide or low interface state oxide film 91 and the junction leak control film 74 are stacked on the semiconductor substrate 51 is adopted in the pixel 21A.

Here, for example, an insulation film containing at least one of elements such as silicon, hafnium, aluminum, tantalum, titanium, yttrium, and the lanthanoids can be used as the junction leak control film 74. Also, for example, an oxide selected from hafnium oxide ($HfO_2$), zirconium oxide ($ZrO_2$), aluminum oxide ($Al_2O_3$), titanium oxide ($TiO_2$), and tantalum pentoxide ($Ta_2O_5$) can be used as the junction leak control film 74.

Figure 8:
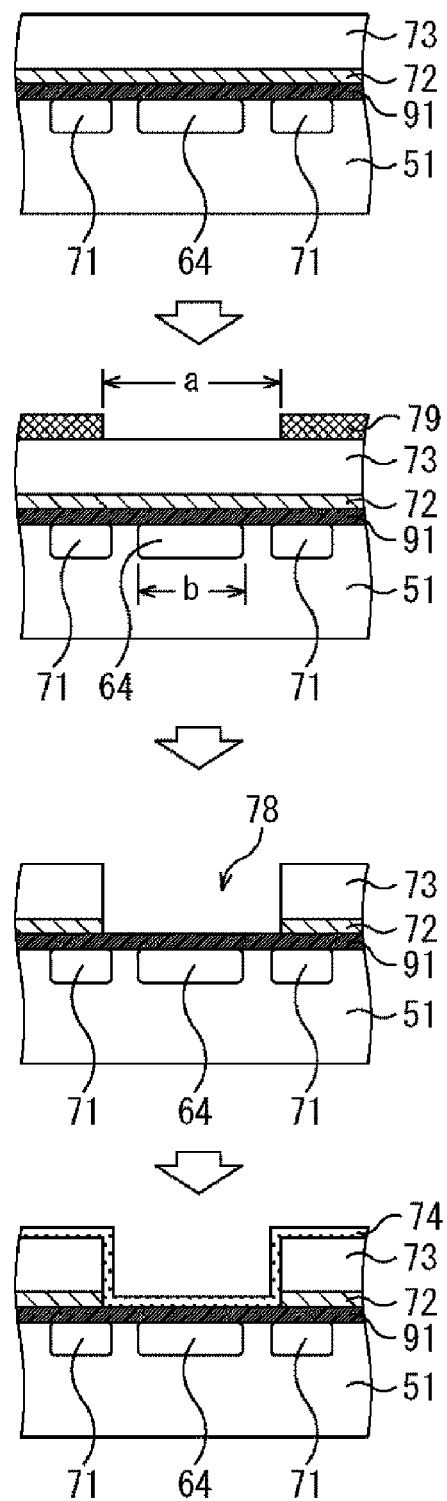
FIG. 8 is a diagram illustrating a process of manufacturing the vicinity of the N-type semiconductor region in the pixel of the second configuration example.

Next, a process of manufacturing the vicinity of the N-type semiconductor region 64 in the pixel 21A will be described with reference to FIG. 8.

First, in a first process, after the N-type semiconductor region 64 and the P-type semiconductor regions 71 are formed in the semiconductor substrate 51 by a general CMOS process, a process of removing an underlying oxide film or a natural oxide film using, for example, dilute hydrofluoric acid (DHF) is performed on the semiconductor substrate 51. Then, the silicon oxide or low interface state oxide film 91 is formed on the surface of the semiconductor substrate 51. For example, silicon oxidation is performed by setting a temperature to 900° C., setting the concentration of $O_2/H_2$ to 10%, and forming a thermal oxide film under the condition of about 3 nm per 10 seconds. Then, the insulation film 72 and the anti-reflection film 73 are formed on the silicon oxide or low interface state oxide film 91.

Next, in a second process, the junction leak control film 74 is patterned to be formed on the silicon oxide or low interface state oxide film 91. That is, as illustrated in FIG. 8, the photoresist film 79 is patterned such that the photoresist film 79 is opened to correspond to the opening 78 in which the insulation film 72 and the anti-reflection film 73 are formed, and is formed on the surface of the anti-reflection film 73. Here, as illustrated in FIG. 8, an opening width a of the patterned photoresist film 79 is greater than a width b of the N-type semiconductor region 64.

Subsequently, in a third process, the opening 78 is formed by dry etching according to the patterning of the photoresist film 79. At this time, to avoid physical scraping of the N-type semiconductor region 64, the anti-reflection film 73 is first processed by dry etching so that the process is stopped by the insulation film 72. Thereafter, the remaining film of the insulation film 72 is peeled off by wet etching using, for example, dilute hydrofluoric acid (DHF) so that the silicon oxide or low interface state oxide film 91 is exposed to the bottom surface of the opening 78. Thereafter, the photoresist film 79 is removed.

Then, in a fourth process, the junction leak control film 74 is formed on the silicon oxide or low interface state oxide film 91 exposed to the bottom surface of the opening 78 so that its film thickness is in the range of, for example, about 1 nm to about 15 nm. Also, the junction leak control film 74 is patterned for a desired layout and is processed by dry etching.

Thereafter, as illustrated in FIG. 7, the inter-layer film 75 is stacked on the junction leak control film 74, a contact hole is formed in the junction leak control film 74 and the inter-layer film 75, the through electrode 77 is formed, and the wiring 76 is subsequently formed. Here, the upper end of the through electrode 77 is connected directly to the wiring 76 and the lower end of the through electrode 77 is connected to the N-type semiconductor region 64 via the silicon oxide or low interface state oxide film 91.

In the pixel 21A, as described above, the stack structure in which the junction leak control film 74 is stacked on the semiconductor substrate 51 via the silicon oxide or low interface state oxide film 91 in the opening 78 is adopted. Thus, in the pixel 21A, it is possible to improve an effect of suppression in a junction leak current flowing from the surface of the N-type semiconductor region 64 to the semiconductor substrate 51.

That is, in the pixel 21A, the stack structure in which the junction leak control film 74 is stacked on the silicon oxide or low interface state oxide film 91 enables a reduction of a depletion layer area while the interface state on the surface of the N-type semiconductor region 64 is maintained low. Accordingly, in the pixel 21A, occurrence of a junction leak current can be reduced more than in the configuration of the pixel 21 even when an electric field is strong. Therefore, it is possible to suppress an increase in a dark current when the electric field is strong, more than the pixel 21.

Figure 9:
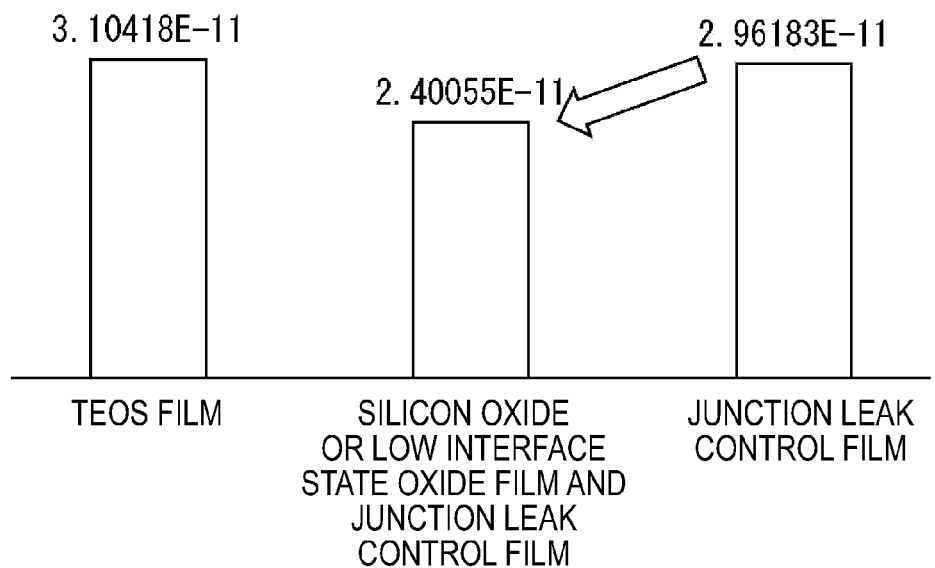
FIG. 9 is a diagram illustrating an evaluation result of a junction leak current.

FIG. 9 is a diagram illustrating an evaluation result of a junction leak current on the surface of the N-type semiconductor region 64.

FIG. 9 illustrates a result of simple electric characteristics when three configurations are adopted for the insulation film formed in the semiconductor substrate 51 in which the N-type semiconductor region 64 is formed. For example, in the middle of FIG. 9, a leak amount is shown in the configuration of the pixel 21A, i.e., the configuration in which the stack structure in which the silicon oxide or low interface state oxide film 91 and the junction leak control film 74 are stacked on the semiconductor substrate 51 is adopted. Also, on the right side of FIG. 9, a leak amount is shown in the configuration of the pixel 21, that is, the configuration in which a structure in which the junction leak control film 74 is stacked on the semiconductor substrate 51 is adopted. Also, on the left side of FIG. 9, a leak amount is shown in a configuration in which a structure in which a TEOS (Tetraethoxysilane) film is stacked as an insulation film in the semiconductor substrate 51 is adopted.

As illustrated in FIG. 9, the leak amount in the configuration of the pixel 21A is 2.40055E-11 [A], the leak amount in the configuration of the pixel 21 is 2.96183E-11 [A], and the leak amount in the configuration in which the TEOS film is adopted as the insulation film is 3.10418E-11 [A]. Thus, by adopting the stack configuration in which the silicon oxide or low interface state oxide film 91 and the junction leak control film 74 are stacked on the semiconductor substrate 51, occurrence of a junction leak current can be suppressed compared to the other configurations.

Figure 10:
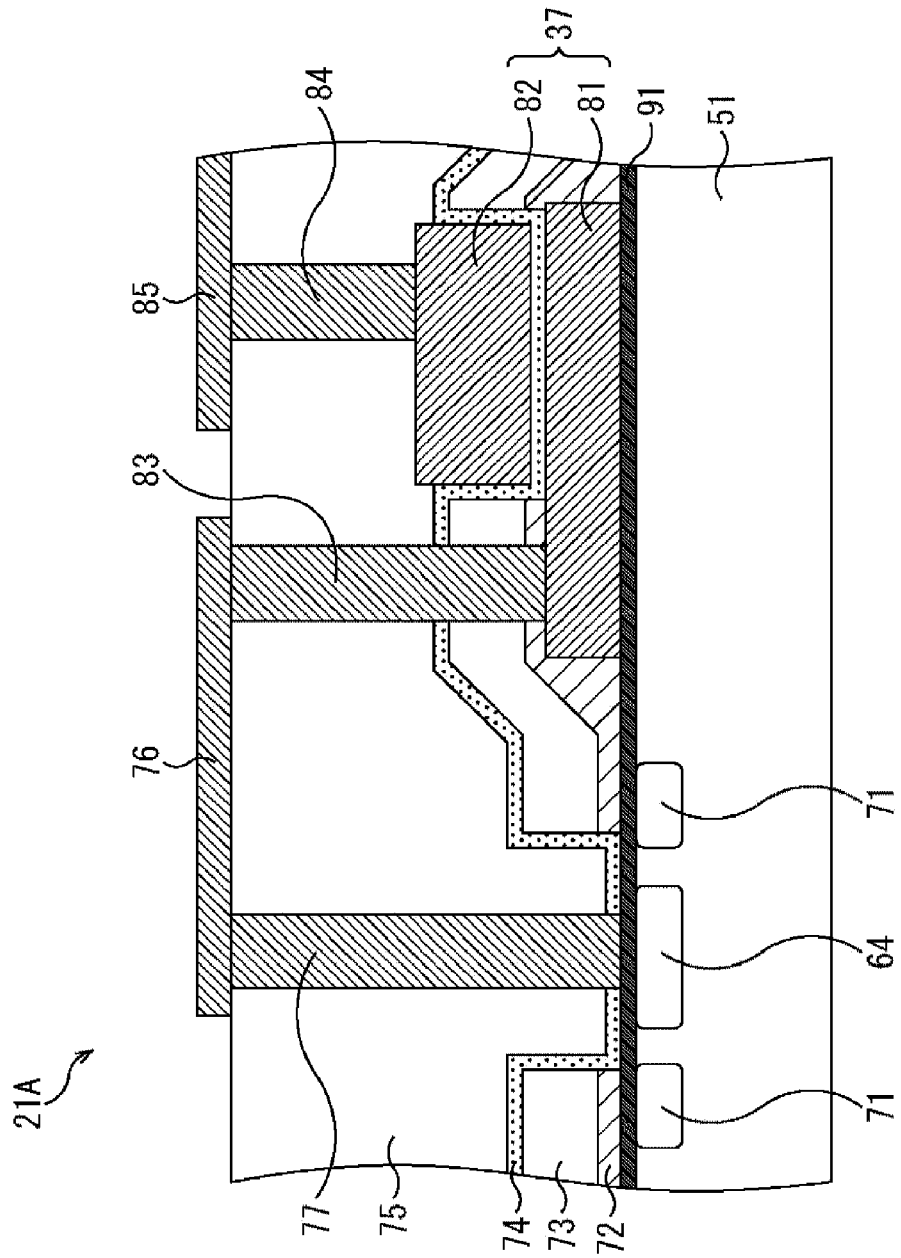
FIG. 10 is a diagram illustrating a cross-sectional configuration of the vicinity of the N-type semiconductor region and the second charge accumulation portion in the pixel of the second configuration example.

Also, as illustrated in FIG. 10, the configuration described with reference to FIG. 6, i.e., the configuration in which the junction leak control film 74 is also used as a capacitor film of the second charge accumulation portion 37, can also be adopted in the pixel 21A.

FIG. 10 illustrates a cross-sectional configuration example of the vicinity of the N-type semiconductor region 64 and the second charge accumulation portion 37. Also, in FIG. 10, the detailed description of the configuration common to the configuration in FIG. 6 will be omitted.

As illustrated in FIG. 10, the pixel 21A is configured to have a stack structure in which the junction leak control film 74 is stacked on the silicon oxide or low interface state oxide film 91 formed on the surface of the semiconductor substrate 51. Also, in the pixel 21A, the lower electrode 81 is stacked over the semiconductor substrate 51 with the silicon oxide or low interface state oxide film 91 interposed therebetween. In addition, the junction leak control film 74 is formed to be sandwiched between the lower electrode 81 and the upper electrode 82 included in the second charge accumulation portion 37, and thus can serve as the capacitor film of the second charge accumulation portion 37.

In the solid-state imaging element 11, however, as described above, it is necessary not only to reduce a dark current in the N-type semiconductor region 64 which is a diffusion layer connected to the second charge accumulation portion 37, but also to reduce a dark current in the PD 31. In general, a film with a large amount of negative fixed charge can reduce the dark current on the PD 31. Accordingly, by forming the junction leak control film 74 (for example, $Al_2O_3$) with a large amount of negative fixed charge in the pixel 21, the dark current in the PD 31 can be considered to be reduced.

A junction leak current in the N-type semiconductor region 64 in a case in which the junction leak control film 74 with a large amount of negative fixed charge is used and a case in which the junction leak control film 74 with a small amount of negative fixed charge is used will be described with reference to FIG. 11.

FIG. 11A illustrates the cross-sectional configuration of the pixel 21 in which the junction leak control film 74 is formed, as in FIG. 4. Also, FIG. 11 illustrates the cross-sectional configuration of the pixel 21 not only in the vicinity of the N-type semiconductor region 64 as in FIG. 4 but also in a portion in which the PD 31 is formed. However, the first charge accumulation portion 36 (FIG. 3) is not illustrated and the insulation film 72 and the anti-reflection film 73 (FIG. 4) are not illustrated.

Also, as illustrated in FIG. 11B, when the junction leak control film 74 (for example, $HfO_2$) with the small amount of negative fixed charge is used, it is possible to suppress occurrence of the junction leak current in the N-type semiconductor region 64. That is, in this case, the junction leak current in the N-type semiconductor region 64 can be reduced more than in a configuration (no negative charge) in which the junction leak control film 74 is not formed. In this case, however, a dark current in the PD 31 can be reduced.

On the other hand, when the junction leak control film 74 (for example, Al2O3) with the large amount of negative fixed charge is used for the purpose of reduction in the dark current in the PD 31, an electric field in the N-type semiconductor region 64 increases and a junction leak current occurs considerably. That is, in this case, the junction leak current increases more than in the configuration in which the junction leak control film 74 is not formed (no negative charge).

Thus, it is difficult to achieve compatibility between the suppression of the occurrence of the junction leak current in the N-type semiconductor region 64 and the reduction in a dark current in the PD 31.

Next, a pixel 21B of a third configuration example will be described with reference to FIG. 12.

Figure 12:
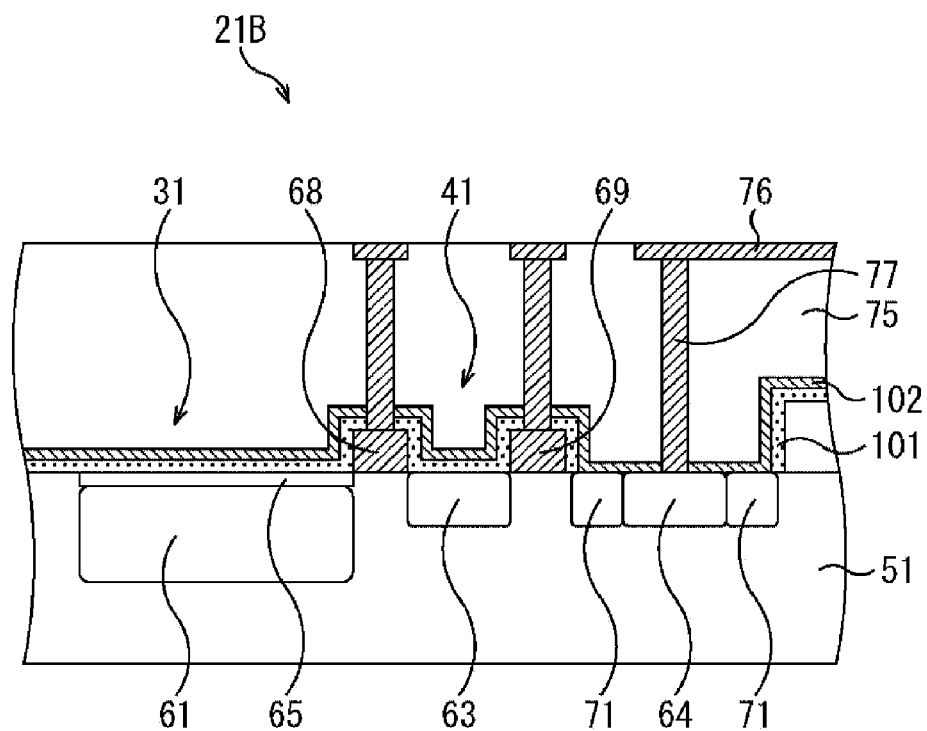
FIG. 12 is a diagram illustrating a cross-sectional configuration of a pixel of a third configuration example.

In the pixel 21B, as illustrated in FIG. 12, the PD 31 is configured by joining and forming the N-type semiconductor region 61 and the P-type semiconductor region 65 in the semiconductor substrate 51, and the FD 41 is configured to include the N-type semiconductor region 63 formed via the gate electrode 68. Also, the N-type semiconductor region 64 that serves as a contact connecting to the second charge accumulation portion 37 is formed from the FD 41 via the gate electrode 69, and the P-type semiconductor regions 71 are formed at a predetermined interval from the N-type semiconductor region 64.

Also, in the pixel 21B, a first negative fixed charge film 101 and a second negative fixed charge film 102 are formed to be stacked above the PD 31, and the second negative fixed charge film 102 is formed as a single layer above the N-type semiconductor region 64. Thus, the pixel 21B can be configured such that an amount of negative fixed charge in the PD 31 is different from an amount of negative fixed charge in the N-type semiconductor region 64.

Also, materials are selected so that the amount of negative fixed charge of the second negative fixed charge film 102 is less than the amount of negative fixed charge of the first negative fixed charge film 101. Thus, the pixel 21B can be configured such that the amount of negative fixed charge in the PD 31 is less than the amount of negative fixed charge in the N-type semiconductor region 64.

Accordingly, in the pixel 21B, the occurrence of a junction leak current is suppressed in the N-type semiconductor region 64 and a dark current can be reduced in the PD 31. That is, in the pixel 21B, the junction leak control film is configured by the second negative fixed charge film 102, and the dark current suppression film is configured by the stack structure of the first negative fixed charge film 101 and the second negative fixed charge film 102.

Figure 13:
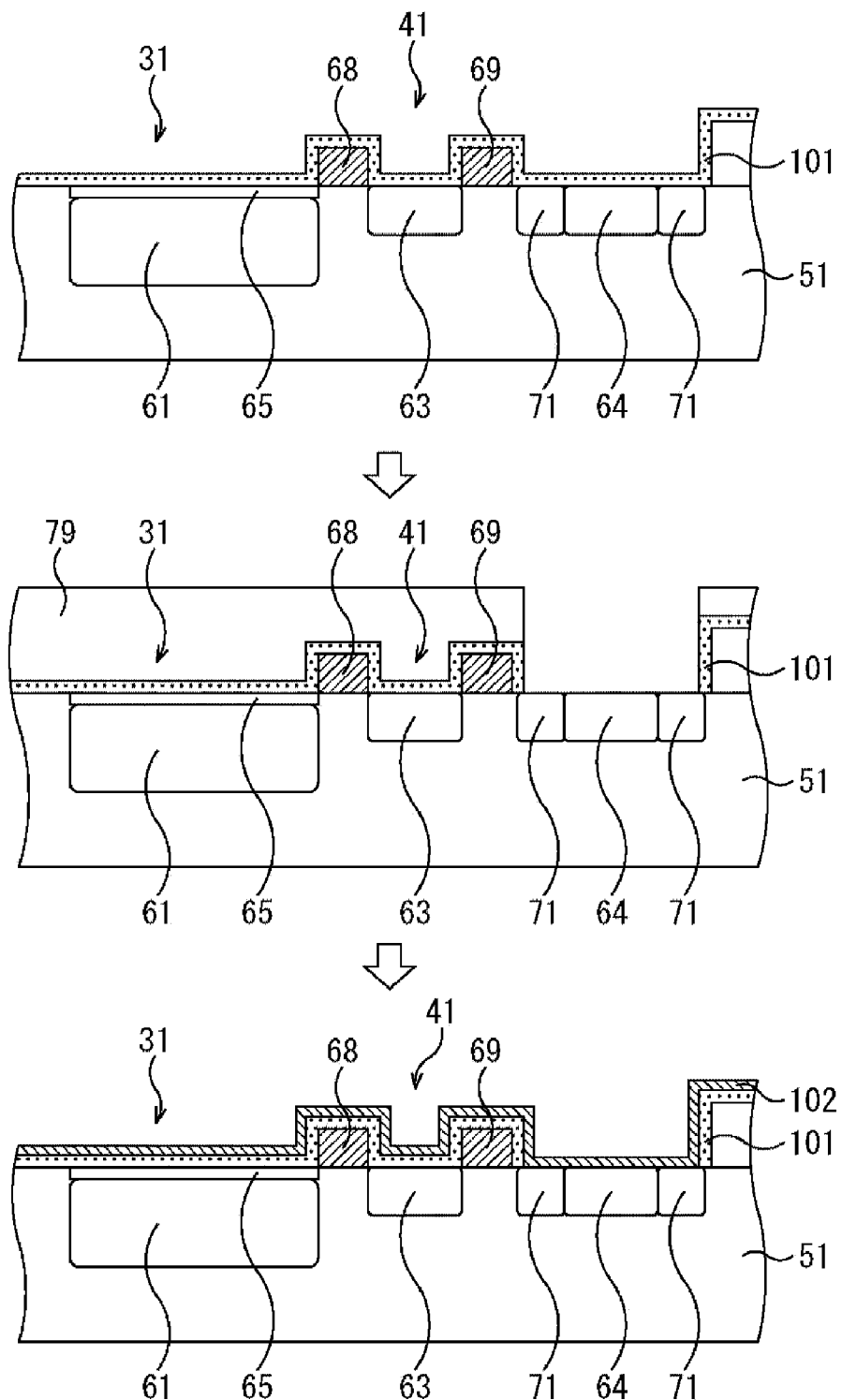
FIG. 13 is a diagram illustrating a process of manufacturing the pixel of the third configuration example.

Next, a process of manufacturing the pixels 21B will be described with reference to FIG. 13.

First, as in a process of manufacturing a CMOS image sensor of the related art, an STI (Shallow Trench Isolation) and an SW (Side Wall) are formed in the semiconductor substrate 51. Thereafter, the N-type semiconductor region 64 is formed by performing ion implantation of an N-type ion species (for example, P or As) on the semiconductor substrate 51. Also, the P-type semiconductor regions 71 are formed by performing ion implantation of a P-type ion species (for example, B or $BF_2$) on the semiconductor substrate 51 at a predetermined interval from the N-type semiconductor region 64. Then, for example, interface treatment is performed by removing an underlying oxide film or a natural oxide film using, for example, dilute hydrofluoric acid (DHF) from the semiconductor substrate 51 and performing a high-temperature ammonia hydrolysis process.

Thereafter, in a first process, the first negative fixed charge film 101 is formed, for example, by forming an $Al_2O_3$ film with a film thickness of about 1 nm to about 15 nm.

Next, in a second process, a photoresist film 79 is formed in the semiconductor substrate 51 and is patterned by lithography to be opened so that the width of the photoresist film 79 is greater than that of the N-type semiconductor region 64. Then, the first negative fixed charge film 101 in the upper portion of the N-type semiconductor region 64 is removed by dry etching or wet etching using dilute hydrofluoric acid (DHF).

Then, in a third process, the photoresist film 79 is removed and interface treatment on the underlying portion is performed by performing a high-temperature ammonia hydrolysis process, and thereafter, the second negative fixed charge film 102 is formed, for example, by forming a $HfO_2$ film with of a film thickness of about 1 nm to about 15 nm. Thereafter, as illustrated in FIG. 12, the inter-layer film 75 is stacked on the second negative fixed charge film 102, a contact hole is formed, a through electrode 77 is formed, and the wiring 76 is subsequently formed.

As described above, the pixel 21B is manufactured such that the stack structure of the first negative fixed charge film 101 and the second negative fixed charge film 102 is formed with respect to the PD 31 and a stack structure of only the second negative fixed charge film 102 is formed with respect to the N-type semiconductor region 64.

Then, a configuration having a relation in which the amount of negative fixed charge in the PD 31 is greater than the amount of negative fixed charge in the N-type semiconductor region 64 is realized by selecting the materials so that the amount of negative fixed charge of the first negative fixed charge film 101 is greater than the amount of negative fixed charge of the second negative fixed charge film 102. Thus, it is possible to manufacture the pixel 21B capable of suppressing the occurrence of the junction leak current in the N-type semiconductor region 64 and reducing the dark current in the PD 31.

Next, a pixel 21C of a fourth configuration example will be described with reference to FIG. 14.

Figure 14:
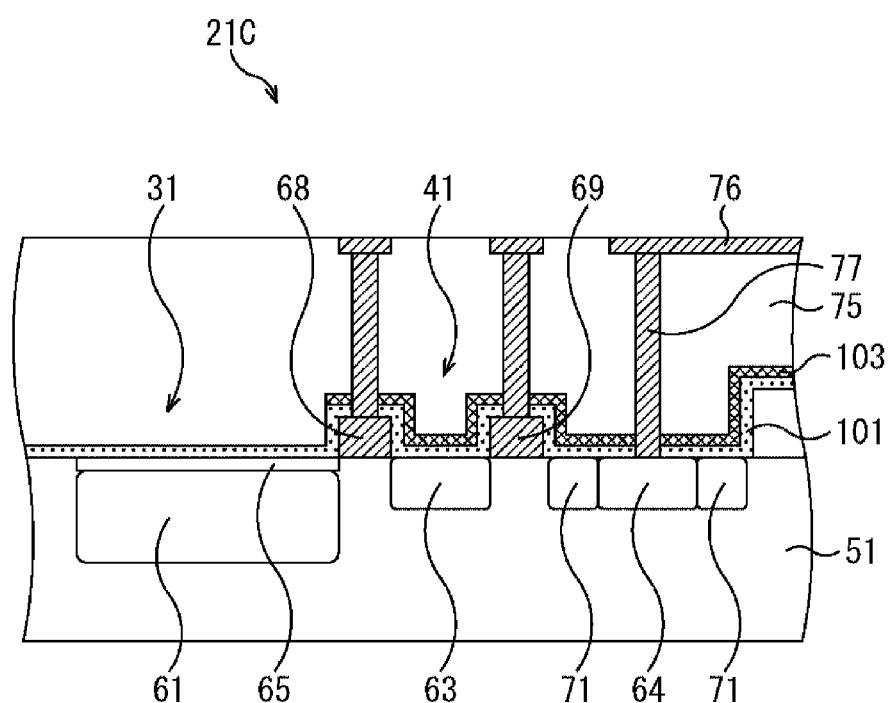
FIG. 14 is a diagram illustrating a cross-sectional configuration of a pixel of a fourth configuration example.

As in the pixel 21B in FIG. 12, the pixel 21C illustrated in FIG. 14 has a configuration having a relation in which the amount of negative fixed charge in the PD 31 is greater than the amount of negative fixed charge in the N-type semiconductor region 64. However, the pixel 21C has the configuration different from the pixel 21B in FIG. 12 in that a stack structure of a first negative fixed charge film 101 and a positive fixed charge film 103 is formed in the N-type semiconductor region 64 and a stack structure of only a first negative fixed charge film 101 is formed in the PD 31. The remaining configuration of the pixel 21C is the same as that of the pixel 21B in FIG. 12, and thus the detailed description thereof will be omitted.

That is, in the pixel 21C, the first negative fixed charge film 101 is formed above the PD 31, and the first negative fixed charge film 101 and the positive fixed charge film 103 are formed to be stacked above the N-type semiconductor region 64. Thus, the pixel 21C can be configured such that the amount of negative fixed charge in the PD 31 is different from the amount of negative fixed charge in the N-type semiconductor region 64. Further, the pixel 21C can be configured such that the amount of negative fixed charge in the N-type semiconductor region 64 is less than the amount of negative fixed charge in the PD 31.

Accordingly, the pixel 21C can suppress occurrence of a junction leak current in the N-type semiconductor region 64 and reduce a dark current in the PD 31. That is, in the pixel 21C, a junction leak control film is formed by the stack structure of the first negative fixed charge film 101 and the positive fixed charge film 103, and a dark current suppression film is formed by the first negative fixed charge film 101.

Figure 15:
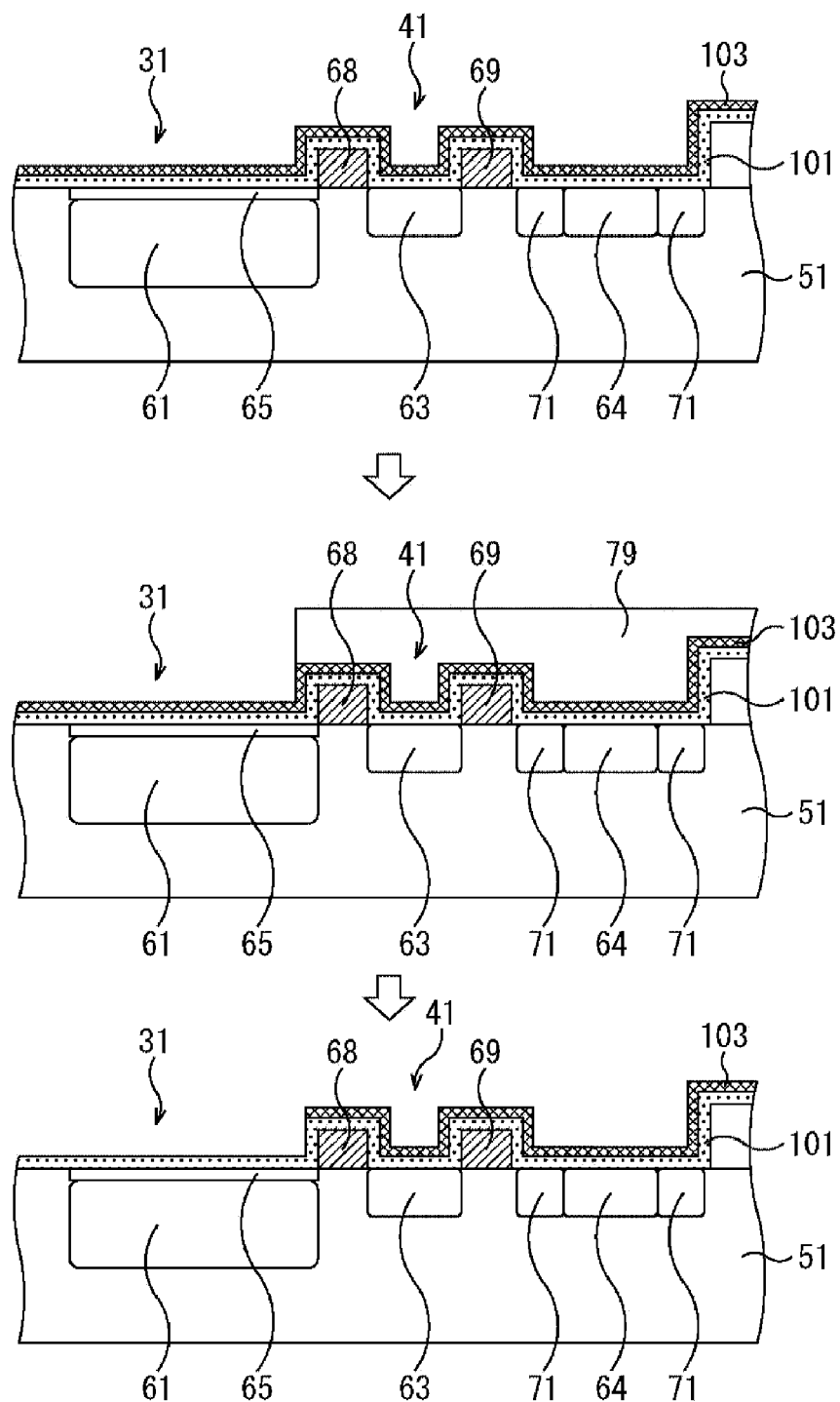
FIG. 15 is a diagram illustrating a process of manufacturing the pixel of the fourth configuration example.

Next, a process of manufacturing the pixel 21C will be described with reference to FIG. 15.

First, as in the process of manufacturing the pixel 21B, the N-type semiconductor region 64 and the P-type semiconductor regions 71 are formed in the semiconductor substrate 51. Thereafter, in a first process, the first negative fixed charge film 101 is formed by forming an Al$_2$O$_3$ film, and the positive fixed charge film 103 is formed by forming a silicon oxide film or a silicon nitride film above the first negative fixed charge film 101.

Next, in a second process, a photoresist film 79 is formed in the semiconductor substrate 51, and the photoresist film 79 is patterned by lithography in the portion in which the PD 31 is formed.

Then, in a third process, the positive fixed charge film 103 in the upper portion of the PD 31 is removed by dry etching or wet etching, and thus the photoresist film 79 is removed. Here, when the positive fixed charge film 103 is removed, the first negative fixed charge film 101 of the pixel 21C is adjusted such that the thickness of the first negative fixed charge film 101 is thicker than that of the first negative fixed charge film 101 of the pixel 21B in FIG. 12 in order to avoid complete removal of the first negative fixed charge film 101 serving as the underlying portion of the positive fixed charge film 103.

Thereafter, as illustrated in FIG. 14, an inter-layer film 75 is stacked on the second negative fixed charge film 102 and the positive fixed charge film 103, the contact hole is formed, the through electrode 77 is formed, and the wiring 76 is subsequently formed.

As described above, the pixel 21C is manufactured such that the stack structure of only the first negative fixed charge film 101 is formed in the PD 31 and the stack structure of the first negative fixed charge film 101 and the positive fixed charge film 103 is formed in the N-type semiconductor region 64. Thus, the configuration having the relation in which the amount of negative fixed charge in the PD 31 is greater than the amount of negative fixed charge in the N-type semiconductor region 64 is realized. Accordingly, it is possible to manufacture the pixel 21C capable of suppressing the occurrence of a junction leak current in the N-type semiconductor region 64 and reducing a dark current in the PD 31.

Next, a pixel 21D of a fifth configuration example will be described with reference to FIG. 16.

Figure 16:
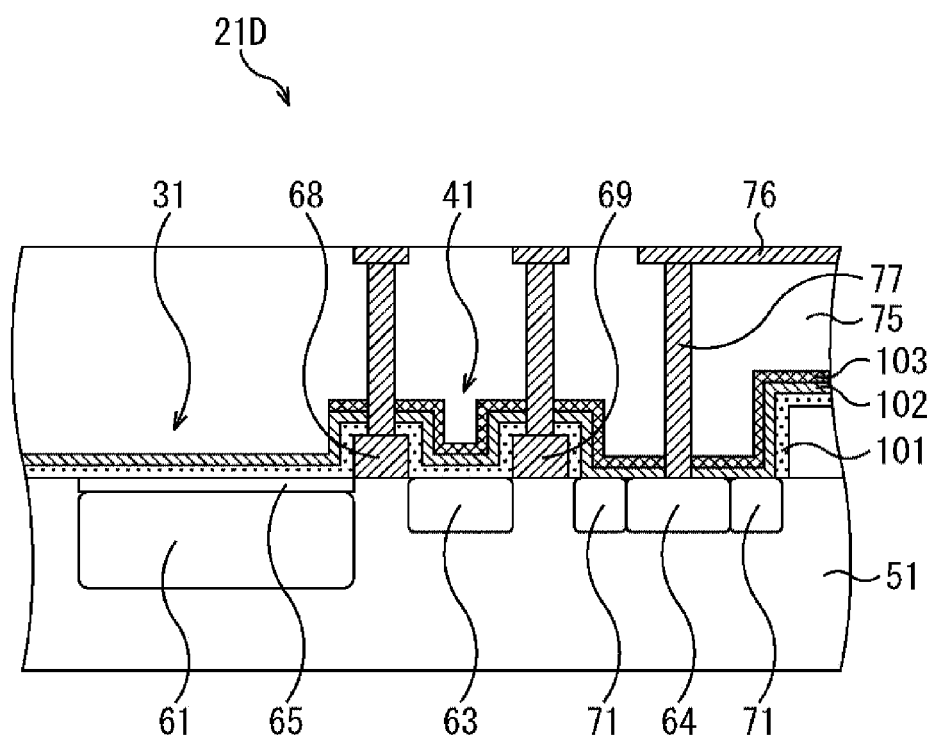
FIG. 16 is a diagram illustrating a cross-sectional configuration of a pixel of a fifth configuration example.

As in the pixel 21B in FIG. 12, the pixel 21D illustrated in FIG. 16 has a configuration having a relation in which the amount of negative fixed charge in the PD 31 is greater than the amount of negative fixed charge in the N-type semiconductor region 64. However, the pixel 21D has the configuration different from the pixel 21B in FIG. 12 in that a stack structure of a second negative fixed charge film 102 and a positive fixed charge film 103 is formed in the N-type semiconductor region 64 and a stack structure of a first negative fixed charge film 101 and the second negative fixed charge film 102 is formed in the PD 31. The remaining configuration of the pixel 21D is the same as that of the pixel 21B in FIG. 12, and thus the detailed description thereof will be omitted.

That is, in the pixel 21D, the first negative fixed charge film 101 and the second negative fixed charge film 102 are formed to be stacked above the PD 31, and the second negative fixed charge film 102 and the positive fixed charge film 103 are formed to be stacked above the N-type semiconductor region 64. Further, the pixel 21D can be configured such that the amount of negative fixed charge in the N-type semiconductor region 64 is less than the amount of negative fixed charge in the PD 31.

Accordingly, the pixel 21D can suppress occurrence of a junction leak current in the N-type semiconductor region 64 and reduce a dark current in the PD 31. That is, in the pixel 21D, a junction leak control film is formed by the stack structure of the second negative fixed charge film 102 and the positive fixed charge film 103, and a dark current suppression film is formed by the stack structure of the first negative fixed charge film 101 and the second negative fixed charge film 102.

Figure 17:
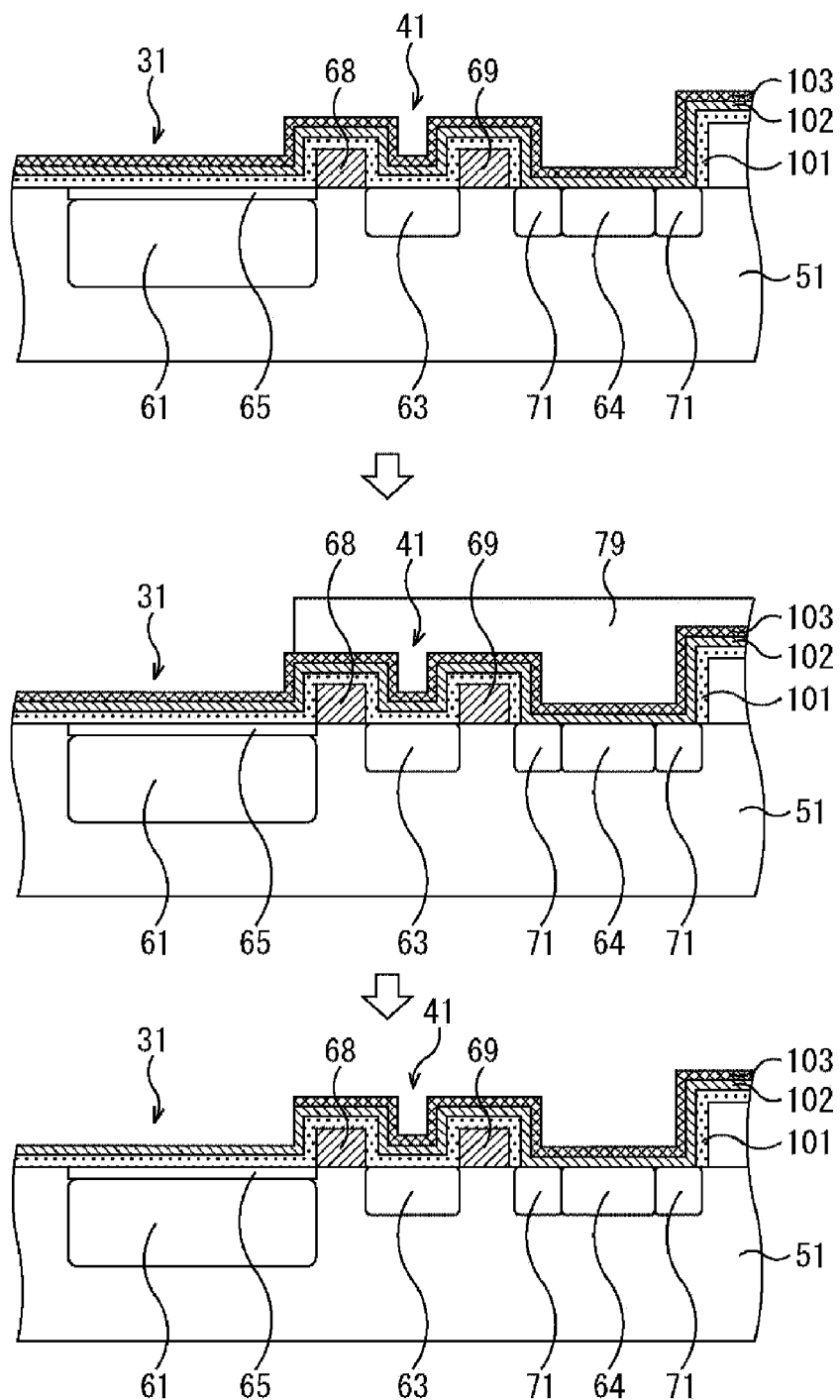
FIG. 17 is a diagram illustrating a process of manufacturing the pixel of the fifth configuration example.

Next, a process of manufacturing the pixel 21D will be described with reference to FIG. 17.

First, as in the process of manufacturing the pixel 21B, the N-type semiconductor region 64 and the P-type semiconductor regions 71 are formed in the semiconductor substrate 51. Thereafter, in a first process, the first negative fixed charge film 101 is formed by forming an Al$_2$O$_3$ film. As in the second process of the pixel 21B, the first negative fixed charge film 101 in the upper portion of the N-type semiconductor region 64 is removed, and the second negative fixed charge film 102 and the positive fixed charge film 103 are subsequently formed to be stacked.

Next, in a second process, a photoresist film 79 is formed in the semiconductor substrate 51, and the photoresist film 79 is patterned by lithography in the portion in which the PD 31 is formed.

Then, in a third process, the positive fixed charge film 103 in the upper portion of the PD 31 is removed by dry etching or wet etching using dilute hydrofluoric acid (DHF), high-temperature phosphoric acid, or the like, and thus the photoresist film 79 is removed. Here, when the positive fixed charge film 103 is removed, the second negative fixed charge film 102 serving as the underlying portion of the positive fixed charge film 103 may be removed. However, the first negative fixed charge film 101 is formed by adjusting the film thickness thereof to avoid complete removal of the lowermost first negative fixed charge film 101.

Thereafter, as illustrated in FIG. 16, an inter-layer film 75 is stacked on the second negative fixed charge film 102 and the positive fixed charge film 103, the contact hole is formed, the through electrode 77 is formed, and the wiring 76 is subsequently formed.

As described above, the pixel 21D is manufactured such that the stack structure of the first negative fixed charge film 101 and the second negative fixed charge film 102 is formed in the PD 31 and the stack structure of the second negative fixed charge film 102 and the positive fixed charge film 103 is formed in the N-type semiconductor region 64. Thus, the configuration having the relation in which the amount of negative fixed charge in the PD 31 is greater than the amount of negative fixed charge in the N-type semiconductor region 64 is realized. Accordingly, it is possible to manufacture the pixel 21D capable of suppressing the occurrence of a junction leak current in the N-type semiconductor region 64 and reducing a dark current in the PD 31.

Here, a relation of the amount of negative fixed charge of the N-type semiconductor region 64 when the stack structure is changed will be described with reference to FIG. 18.

Figure 18:
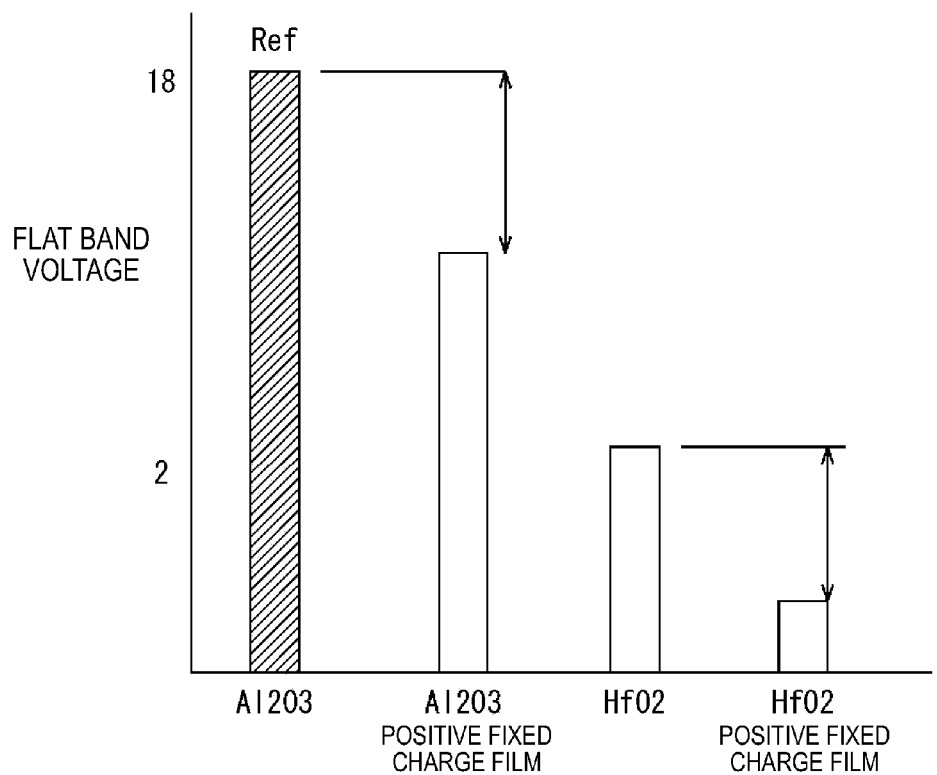
FIG. 18 is a diagram for describing a relation of an amount of negative fixed charge of the N-type semiconductor region when a stack configuration is changed.

FIG. 18 illustrates a flat band voltage when the stack structure in the N-type semiconductor region 64 is changed. For example, comparison at the time of application of the flat band voltage of 18 V is shown when an $Al_2O_3$ film is formed as the junction leak control film 74 in the configuration of the pixel 21 in FIG. 4.

As illustrated in FIG. 18, compared to the stack structure in which only the $Al_2O_3$ film is stacked as the junction leak control film 74 in the pixel 21 in FIG. 4, the flat band voltage can be reduced by forming the configuration of the pixel 21C in FIG. 14, i.e., the stack structure in which an $Al_2O_3$ film is formed as the first negative fixed charge film 101 and the positive fixed charge film 103 is stacked.

Also, compared to the configuration of the pixel 21B in FIG. 12, i.e., the configuration in which the $HfO_2$ film is formed as the first negative fixed charge film 101, the flat band voltage can be reduced by forming the configuration of the pixel 21D in FIG. 16, i.e., the stack structure in which a $HfO_2$ film is formed as the first negative fixed charge film 101 and the positive fixed charge film 103 is stacked.

Also, the reduction in the flat band voltage by the configuration of the pixel 21C in FIG. 14 and the reduction in the flat band voltage by the configuration of the pixel 21D in FIG. 16 can be adjusted by a film thickness, annealing, or the like. In addition, since the degree of adjustment can differ by designing the solid-state imaging element 11 or the pixel, the reduction in the flat band voltage is adjusted so that a negative fixed charge is suitable for each device.

In the present embodiment, the configurations in which the N-type semiconductor region 64 and the P-type semiconductor regions 71 are formed in the semiconductor substrate 51 have been described, but the configuration of the ion implantation can be changed in the configuration examples of all of the above-described pixels 21. That is, a high-concentration P-type semiconductor region (P-type ion species: B, BF2, or the like) may be formed as a diffusion layer serving as a connection portion with the second charge accumulation portion 37 in the semiconductor substrate 51 and N-type semiconductor regions (N-type ion species: P, As, or the like) may be formed at a predetermined interval from the diffusion layer.

Also, for example, the solid-state imaging element 11 can be applied to any one of a surface irradiation type CMOS image sensor in which incident light is radiated from a surface side on which a wiring layer is stacked in the semiconductor substrate 51 and a backside irradiation type CMOS image sensor in which incident light is irradiated from a backside opposite to the surface side on which the wiring layer is stacked in the semiconductor substrate 51.

Further, the solid-state imaging element 11 as described above, for example, can be applied to various electronic devices, such as an imaging system such as a digital still camera or a digital video camera, a mobile phone having an imaging function, or other devices having an imaging function.

Figure 19:
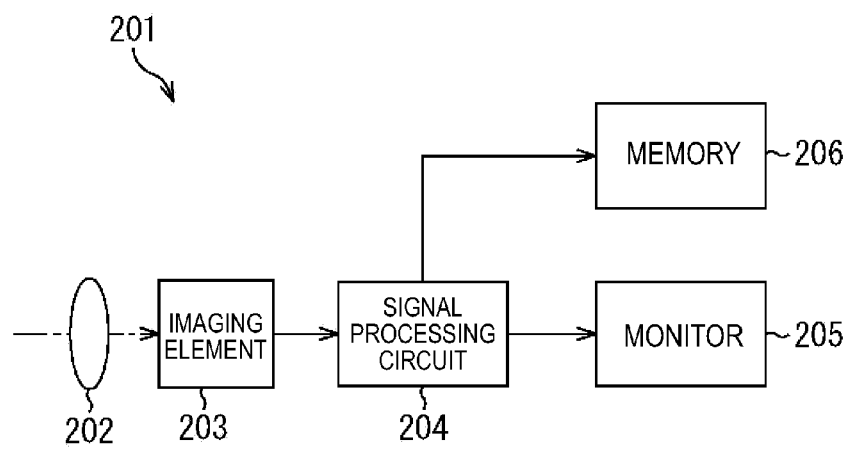
FIG. 19 is a block diagram illustrating a configuration example of an imaging device mounted on an electronic device.

FIG. 19 is a block diagram illustrating a configuration example of an imaging device mounted on an electronic device.

As illustrated in FIG. 19, an imaging device 201 includes an optical system 202, an imaging element 203, a signal processing circuit 204, a monitor 205, and a memory 206, and is configured such that a still image and a moving image can be captured.

The optical system 202 includes one or a plurality of lenses, and guides image light (incident light) from a subject to the imaging element 203, such that an image is formed on a light receiving surface (sensor unit) of the imaging element 203.

The solid-state imaging element 11 in the configuration example described above is applied as the imaging element 203. Electric charges are accumulated in the imaging element 203 for a certain period of time according to the image formed on the light receiving surface through the optical system 202. Also, a signal corresponding to the electric charges accumulated in the imaging element 203 is supplied to the signal processing circuit 204.

The signal processing circuit 204 performs various kinds of signal processing on the signal charge output from the imaging element 203. An image (image data) obtained when the signal processing circuit 204 performs the signal processing is supplied to the monitor 205 to be displayed or is supplied to the memory 206 to be stored (recorded).

By applying the solid-state imaging element 11 including the pixels 21 of the configuration examples described above as the imaging element 203 to the imaging device 201, it is possible to suppress occurrence of a dark current and acquire higher image quality.

Additionally, the present technology may also be configured as below.

(1)

A solid-state imaging element including:

a high-concentration diffusion layer configured to serve as a connection portion by which a wiring is connected to a semiconductor substrate; and a junction leak control film formed to cover a surface of the diffusion layer.

(2)

The solid-state imaging element according to (1), wherein, to connect the wiring to the diffusion layer, a width of an opening formed in an insulation film stacked on the semiconductor substrate is greater than a width of the diffusion layer.

(3)

The solid-state imaging element according to (1) or (2), further including:

a charge accumulation portion configured to accumulate a charge generated by a photoelectric conversion portion generating the charge according to an amount of received light, wherein the junction leak control film is also used as a capacitor film of the charge accumulation portion.

(4)

The solid-state imaging element according to any one of (1) to (3), wherein a silicon oxide or low interface state oxide film is formed between the diffusion layer and the junction leak control film, and a stack structure in which the silicon oxide or low interface state oxide film and the junction leak control film are stacked on the semiconductor substrate is included.

(5)

The solid-state imaging element according to any one of (1) to (4), further including:

a photoelectric conversion portion configured to generate and accumulate a charge according to an amount of radiated light; and a dark current suppression film formed to cover a surface of the photoelectric conversion portion, wherein the junction leak control film over the diffusion layer and the dark current suppression film over the photoelectric conversion portion are different in an amount of negative fixed charge.

(6)

The solid-state imaging element according to any one of (1) to (5), wherein the amount of negative fixed charge of the junction leak control film over the diffusion layer is set to be less than the amount of negative fixed charge of the dark current suppression film over the photoelectric conversion portion.

(7)

The solid-state imaging element according to any one of (1) to (6), wherein the dark current suppression film formed over the photoelectric conversion portion is configured to have a stack structure of the first negative fixed charge film and a second negative fixed charge film having an amount of fixed charge less than an amount of fixed charge of the first negative fixed charge film, and wherein the junction leak control film formed over the diffusion layer is formed by the second negative fixed charge film.

(8)

The solid-state imaging element according to any one of (1) to (6), wherein the junction leak control film formed over the diffusion layer is configured to have a stack structure of a negative fixed charge film and a positive fixed charge film, and wherein the dark current suppression film formed over the photoelectric conversion portion is formed by the negative fixed charge film.

(9)

The solid-state imaging element according to any one of (1) to (6), wherein the dark current suppression film formed over the photoelectric conversion portion is configured to have a stack structure of the first negative fixed charge film and a second negative fixed charge film having an amount of fixed charge less than an amount of fixed charge of the first negative fixed charge film, and wherein the junction leak control film formed over the diffusion layer is configured to have a stack structure of the second negative fixed charge film and a positive fixed charge film.

Further, the present embodiment is not limited to the embodiment described above and various changes can be made without departing from the gist of the present disclosure.

REFERENCE SIGNS LIST 11 solid-state imaging element
12 pixel array unit
13 vertical driving unit
14 column processing unit
15 horizontal driving unit
16 output unit
17 driving control unit
21 pixel
22 horizontal signal lines
23 vertical signal lines
31 PD
32 first transfer gate
33 second transfer gate
34 third transfer gate
35 reset transistor
36 first charge accumulation portion
37 second charge accumulation portion
38 amplification transistor
39 selection transistor
40 charge discharge gate
41 FD
42 constant current source
51 semiconductor substrate
52 N-type semiconductor substrate
53 P-type well
61 to 64 N-type semiconductor region
65 and 66 P-type semiconductor region
67 to 69 gate electrode
71 P-type semiconductor region
72 insulation film
73 anti-reflection film
74 junction leak control film
75 inter-layer film
76 wiring
77 through electrode
81 lower electrode
82 upper electrode
83 and 84 through electrode
85 wiring
91 silicon oxide or low interface state oxide film
101 first negative fixed charge film
102 second negative fixed charge film
103 positive fixed charge film

The invention claimed is:

1. A solid-state imaging element comprising:
a high-concentration diffusion layer configured to serve as a connection portion by which a wiring is connected to a semiconductor substrate; and
a junction leak control film formed to cover a surface of the diffusion layer,
wherein, to connect the wiring to the diffusion layer, a width of an opening formed in an insulation film stacked on the semiconductor substrate is greater than a width of the diffusion layer.

2. A solid-state imaging element comprising:
a high-concentration diffusion layer configured to serve as a connection portion by which a wiring is connected to a semiconductor substrate;
a junction leak control film formed to cover a surface of the diffusion layer; and
a charge accumulation portion configured to accumulate a charge generated by a photoelectric conversion portion generating the charge according to an amount of received light,
wherein the junction leak control film is also used as a capacitor film of the charge accumulation portion.

3. The solid-state imaging element according to claim 1, wherein a silicon oxide or low interface state oxide film is formed between the diffusion layer and the junction leak control film, and the silicon oxide or low interface state oxide film and the junction leak control film are arranged in a stacked structure on the semiconductor substrate.

4. A solid-state imaging element comprising:
a high-concentration diffusion layer configured to serve as a connection portion by which a wiring is connected to a semiconductor substrate;
a junction leak control film formed to cover a surface of the diffusion layer;
a photoelectric conversion portion configured to generate and accumulate a charge according to an amount of radiated light; and
a dark current suppression film formed to cover a surface of the photoelectric conversion portion,
wherein the junction leak control film over the diffusion layer and the dark current suppression film over the photoelectric conversion portion are different in an amount of negative fixed charge.

5. The solid-state imaging element according to claim 4, wherein the amount of negative fixed charge of the junction leak control film over the diffusion layer is set to be less than the amount of negative fixed charge of the dark current suppression film over the photoelectric conversion portion.

6. The solid-state imaging element according to claim 5, wherein the dark current suppression film formed over the photoelectric conversion portion is configured to have a stack structure of the first negative fixed charge film and a second negative fixed charge film having an amount of fixed charge less than an amount of fixed charge of the first negative fixed charge film, and
wherein the junction leak control film formed over the diffusion layer is formed by the second negative fixed charge film.

7. The solid-state imaging element according to claim 5, wherein the junction leak control film formed over the diffusion layer is configured to have a stack structure of a negative fixed charge film and a positive fixed charge film, and
wherein the dark current suppression film formed over the photoelectric conversion portion is formed by the negative fixed charge film.

8. The solid-state imaging element according to claim 5, wherein the dark current suppression film formed over the photoelectric conversion portion is configured to have a stack structure of the first negative fixed charge film and a second negative fixed charge film having an amount of fixed charge less than an amount of fixed charge of the first negative fixed charge film, and
wherein the junction leak control film formed over the diffusion layer is configured to have a stack structure of the second negative fixed charge film and a positive fixed charge film.

9. An electronic device comprising the solid state imaging element according to claim 1.

10. The electronic device according to claim 9, wherein a silicon oxide or low interface state oxide film is formed between the diffusion layer and the junction leak control film, and the silicon oxide or low interface state oxide film and the junction leak control film are arranged in a stacked structure on the semiconductor substrate.

11. An electronic device comprising the solid state imaging element according to claim 2.

12. An electronic device comprising the solid state imaging element according to claim 4.

13. The electronic device according to claim 12, wherein the amount of negative fixed charge of the junction leak control film over the diffusion layer is set to be less than the amount of negative fixed charge of the dark current suppression film over the photoelectric conversion portion.

14. The electronic device according to claim 13, wherein the dark current suppression film formed over the photoelectric conversion portion is configured to have a stack structure of the first negative fixed charge film and a second negative fixed charge film having an amount of fixed charge less than an amount of fixed charge of the first negative fixed charge film, and wherein the junction leak control film formed over the diffusion layer is formed by the second negative fixed charge film.

15. The electronic device according to claim 13, wherein the junction leak control film formed over the diffusion layer is configured to have a stack structure of a negative fixed charge film and a positive fixed charge film, and wherein the dark current suppression film formed over the photoelectric conversion portion is formed by the negative fixed charge film.

16. The electronic device according to claim 13, wherein the dark current suppression film formed over the photoelectric conversion portion is configured to have a stack structure of the first negative fixed charge film and a second negative fixed charge film having an amount of fixed charge less than an amount of fixed charge of the first negative fixed charge film, and wherein the junction leak control film formed over the diffusion layer is configured to have a stack structure of the second negative fixed charge film and a positive fixed charge film.

* * * * *